(12) United States Patent
Takahashi et al.

(10) Patent No.: US 11,876,032 B2
(45) Date of Patent: Jan. 16, 2024

(54) SEMICONDUCTOR DEVICE

(71) Applicant: Murata Manufacturing Co., Ltd., Kyoto-fu (JP)

(72) Inventors: Shinnosuke Takahashi, Nagaokakyo (JP); Masayuki Aoike, Nagaokakyo (JP); Masatoshi Hase, Nagaokakyo (JP); Fumio Harima, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 275 days.

(21) Appl. No.: 17/504,316

(22) Filed: Oct. 18, 2021

(65) Prior Publication Data
US 2022/0122901 A1 Apr. 21, 2022

(30) Foreign Application Priority Data

Oct. 21, 2020 (JP) ................. 2020-176595

(51) Int. Cl.
*H01L 23/373* (2006.01)
*H01L 25/065* (2023.01)
*H01L 25/18* (2023.01)
*H01L 23/00* (2006.01)
(Continued)

(52) U.S. Cl.
CPC ...... *H01L 23/3738* (2013.01); *H01L 23/3736* (2013.01); *H01L 24/08* (2013.01); *H01L 24/13* (2013.01); *H01L 25/0657* (2013.01); *H01L 25/18* (2013.01); *H01L 25/50* (2013.01); *H01L 24/05* (2013.01); *H01L 24/24* (2013.01); *H01L 29/7371* (2013.01); *H01L 2224/05644* (2013.01); *H01L 2224/08145* (2013.01); *H01L 2224/1357* (2013.01); *H01L 2224/13147* (2013.01); *H01L 2224/13644* (2013.01); *H01L 2224/24146* (2013.01)

(58) Field of Classification Search
CPC H01L 23/3738; H01L 23/3736; H01L 25/065
See application file for complete search history.

(56) References Cited

U.S. PATENT DOCUMENTS

| 2005/0070048 A1* | 3/2005 | Tolchinsky | ......... H01L 23/3735 257/E23.09 |
|---|---|---|---|
| 2019/0326191 A1 | 10/2019 | Kondo et al. | |
| 2019/0341381 A1 | 11/2019 | Dutta et al. | |

FOREIGN PATENT DOCUMENTS

| JP | 2016-103540 A | 6/2016 |
|---|---|---|
| JP | 2016-219682 A | 12/2016 |

* cited by examiner

*Primary Examiner* — Dale E Page
*Assistant Examiner* — Wilner Jean Baptiste
(74) *Attorney, Agent, or Firm* — Studebaker & Brackett PC

(57) ABSTRACT

A bond layer including at least one metal region in a plan view is disposed on a surface layer portion of a substrate formed from a semiconductor. A semiconductor element is disposed on the bond layer and includes a first transistor disposed on a first metal region that is a metal region as the at least one metal region of the bond layer and including a collector layer electrically coupled to the first metal region, a base layer disposed on the collector layer, and an emitter layer disposed on the base layer. A first emitter electrode is disposed on the emitter layer of the first transistor. A first conductor protrusion is disposed on the first emitter electrode. The thermal conductivity of the semiconductor material of the surface layer portion is higher than that of each of the collector layer, the base layer, and the emitter layer of the first transistor.

20 Claims, 17 Drawing Sheets

(51) Int. Cl.
*H01L 25/00* (2006.01)
*H01L 29/737* (2006.01)

SEMICONDUCTOR DEVICE

CROSS-REFERENCE TO RELATED APPLICATION

This application claims benefit of priority to Japanese Patent Application No. 2020-176595, filed Oct. 21, 2020, the entire content of which is incorporated herein by reference.

BACKGROUND

Technical Field

The present disclosure relates to a semiconductor device.

Background Art

Heterojunction bipolar transistors (HBTs) are used for an amplifier circuit for radio frequency signals. To perform high output from the amplifier circuit, improvement of the characteristics of heat radiation from the HBTs is desired. Japanese Unexamined Patent Application Publication No. 2016-219682 discloses a HBT having improved heat radiation characteristics. The HBT disclosed in Japanese Unexamined Patent Application Publication No. 2016-219682 includes a base layer and an emitter layer that are laminated above a collector layer, and a collector electrode is disposed under the collector layer. The collector electrode is bonded to a heat radiation substrate, and thereby heat generated from the HBT is conducted to the heat radiation substrate and radiated from the heat radiation substrate to the outside.

SUMMARY

For further improvement of output from an amplifier circuit, further improvement of characteristics of heat radiation from a transistor such as the HBT is desired. Accordingly, the present disclosure provides a semiconductor device enabled to improve the characteristics of heat radiation from a transistor.

According to an aspect of the present disclosure, there is provided a semiconductor device including a substrate including a surface layer portion formed from a semiconductor material; a bond layer disposed on the surface layer portion of the substrate and including at least one metal region in a plan view; and at least one semiconductor element disposed on the bond layer. The at least one semiconductor element includes a first transistor disposed on a first metal region that is a metal region serving as the at least one metal region of the bond layer. The first transistor includes a collector layer electrically coupled to the first metal region, a base layer disposed on the collector layer, and an emitter layer disposed on the base layer. The semiconductor device further includes a first emitter electrode disposed on the emitter layer of the first transistor and electrically coupled to the emitter layer; and a first conductor protrusion disposed above the first emitter electrode, electrically coupled to the first emitter electrode, and protruding in a direction of going away from the substrate. Thermal conductivity of the semiconductor material of the surface layer portion of the substrate is higher than thermal conductivity of each of the collector layer, the base layer, and the emitter layer of the first transistor.

Heat generated from the first transistor is conducted to a member coupled to the first conductor protrusion, via the first emitter electrode and the first conductor protrusion. Further, the heat generated from the first transistor is conducted to the substrate with the bond layer interposed therebetween. As described above, the heat generated from the first transistor is conducted in two directions, and thus the characteristics of heat radiation from the first transistor can be improved.

Other features, elements, characteristics and advantages of the present disclosure will become more apparent from the following detailed description of preferred embodiments of the present disclosure with reference to the attached drawings.

DETAILED DESCRIPTION

First Embodiment

A semiconductor device according to a first embodiment will be described with reference to FIGS. 1 to 5B.

Figure 1:
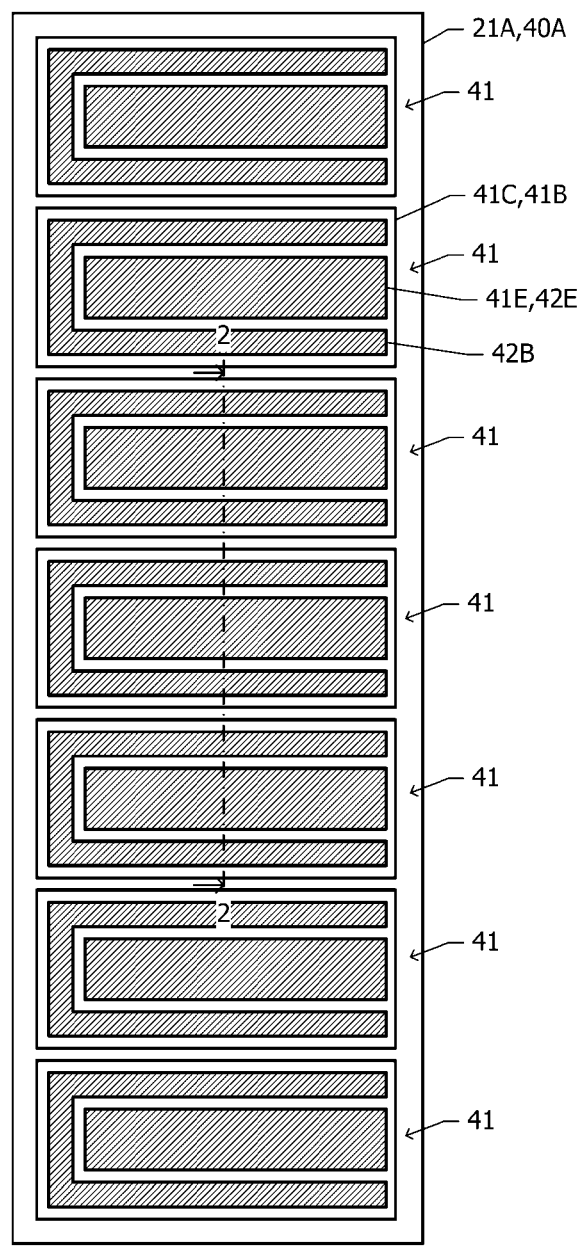
FIG. 1 is a schematic plan view of a semiconductor device according to a first embodiment.

FIG. 1 is a schematic plan view of the semiconductor device according to the first embodiment. A bond layer including a first metal region 21A is disposed on the substrate. A first conducting region 40A serving as a foundation semiconductor layer is disposed in such a manner as to substantially overlap with the first metal region 21A. On the first conducting region 40A, a plurality of semiconductor elements are disposed. A plurality of first transistors 41 are disposed as the plurality of semiconductor elements.

Each first transistor 41 includes a collector layer 41C, a base layer 41B, and an emitter layer 41E. The collector layer 41C and the base layer 41B substantially overlap with each other in a plan view. In the plan view, the emitter layer 41E is smaller than the base layer 41B and included in the base layer 41B.

In the plan view, first emitter electrodes 42E are each disposed in such a manner as to substantially overlap with the emitter layer 41E. In the plan view, each first emitter electrode 42E has a shape extending in one direction (right and left direction in FIG. 1). The shape of the first emitter electrode 42E in the plan view is, for example, substantially a rectangle. In the plan view, U-shaped first base electrodes 42B are each disposed spaced away from the two long sides and one short side of the corresponding first emitter electrode 42E. Each first emitter electrode 42E and each first base electrode 42B are hatched in FIG. 1. The plurality of first transistors 41 are disposed in a width direction orthogonal to the longitudinal direction of the first emitter electrode 42E.

Figure 2:
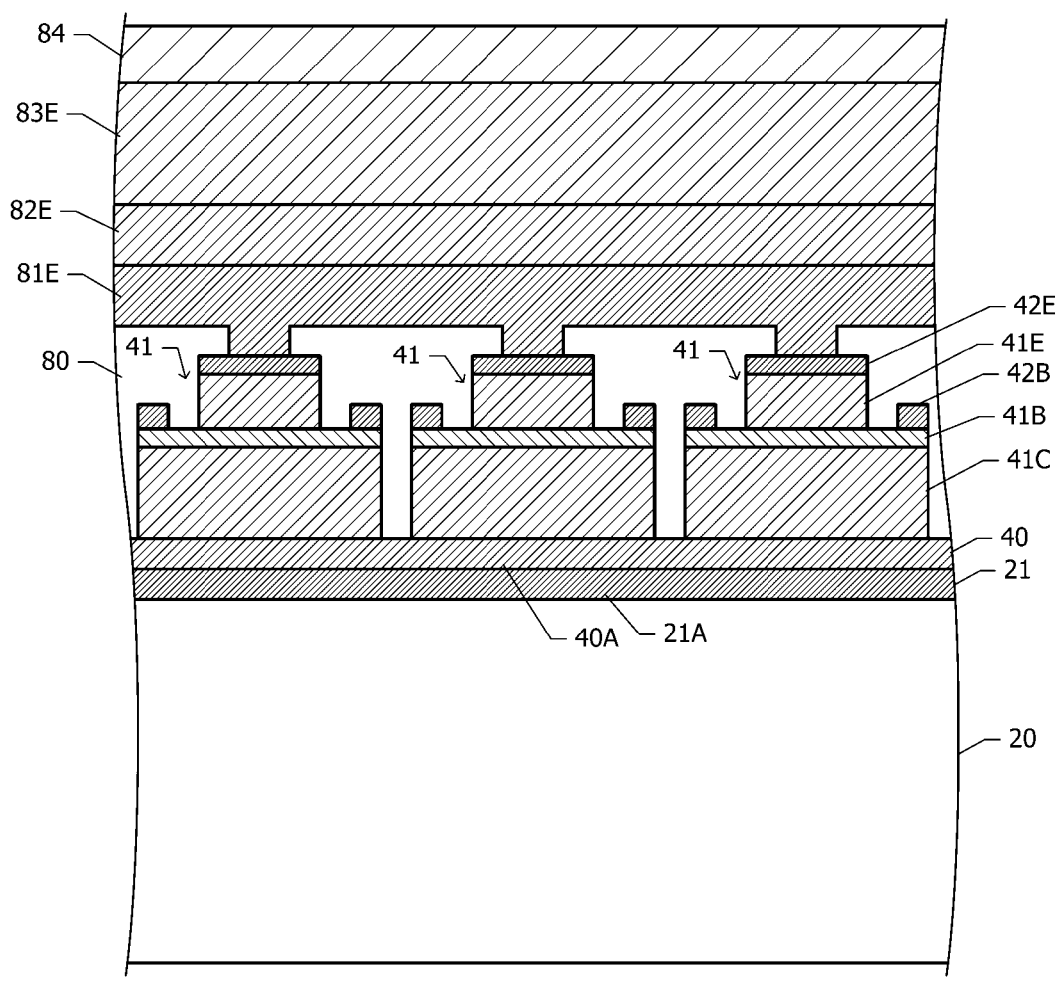
FIG. 2 is a cross-sectional view taken along an alternate long and short dash line 2-2 in FIG. 1.

FIG. 2 is a cross-sectional view taken along the alternate long and short dash line 2-2 in FIG. 1. A bond layer 21 is disposed on a substrate 20. The bond layer 21 includes at least one first metal region 21A. FIG. 2 illustrates a cross section of a first metal region 21A in the bond layer 21. The substrate 20 includes a surface layer portion formed from a semiconductor. For example, a silicon substrate or a silicon on insulator (SOI) substrate may be used as the substrate 20.

A foundation semiconductor layer 40 formed from a semiconductor is disposed above the bond layer 21 and is bonded thereto. The foundation semiconductor layer 40 includes the conductive first conducting region 40A and an element isolating region that is insulated. FIG. 2 illustrates a cross section of the first conducting region 40A. The plurality of first transistors 41 are disposed on the first conducting region 40A.

Each first transistor 41 includes the collector layer 41C, the base layer 41B, and the emitter layer 41E that are laminated in order from the substrate 20 side. The first transistor 41 is, for example, a heterojunction bipolar transistor. For example, the first conducting region 40A of the foundation semiconductor layer 40 and the collector layer 41C are formed from n-type GaAs, and the base layer 41B is formed from p-type GaAs. The emitter layer 41E includes two layers, that is, for example, an n-type InGaP layer and an n-type GaAs layer disposed thereon. Note that these semiconductor layers may be formed from any of other compound semiconductors such as InP, GaN, SiGe, or SiC.

The collector layer 41C is electrically coupled to the first metal region 21A with the first conducting region 40A interposed therebetween. The first metal region 21A functions as the collector electrode of the first transistor 41. The emitter layer 41E is disposed on a partial region of the base layer 41B. The emitter layer 41E may be disposed on the entire region of the base layer 41B, and an emitter mesa may be disposed on a partial region of the emitter layer 41E. In this configuration, a region overlapping with the emitter mesa in a plan view substantially functions as an emitter layer.

The first base electrode 42B is disposed on the base layer 41B, and the first emitter electrode 42E is disposed on the emitter layer 41E. The first base electrode 42B is electrically coupled to the base layer 41B, and the first emitter electrode 42E is electrically coupled to the emitter layer 41E.

A first emitter wire 81E is disposed on the first emitter electrode 42E with an interlayer dielectric 80 interposed therebetween. The first emitter wire 81E couples the plurality of first emitter electrodes 42E to each other through cavities provided in the interlayer dielectric 80. Note that the first conducting region 40A and the first metal region 21A also couple the collector layers 41C of the respective first transistors 41 to each other. That is, the plurality of first transistors 41 are coupled in parallel.

A first emitter pad 82E and a first conductor protrusion 83E are disposed above the first emitter wire 81E. Solder 84 is put on the first conductor protrusion 83E. The structure in which the solder 84 put on the first conductor protrusion 83E formed from Cu is called a Cu pillar bump. Note that a structure in which solder is not provided on the top surface, like an Au bump, may be used for the first conductor protrusion 83E. The protrusion having the structure as described above is also called a pillar. A structure in which a conductor post is provided on the pad may also be employed for the first conductor protrusion 83E. The conductor protrusion having the structure as described is also called a post. A ball bump shaped like a ball after reflow with solder may also be used for the first conductor protrusion 83E. Various structures including a conductor protruding from the substrate in addition to these described various structures may be used for the conductor protrusion.

A method for manufacturing the semiconductor device according to the first embodiment will then be described with reference to FIGS. 3A to 4D. FIGS. 3A to 4C are each a schematic cross-sectional view of the semiconductor device in the course of manufacturing, and FIG. 4D is a schematic cross-sectional view of the completed semiconductor device.

Figure 3A:
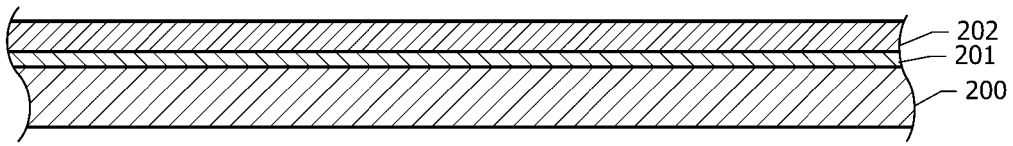
FIGS. 3A to 3F are each a schematic cross-sectional view of the semiconductor device in the course of manufacturing.

As illustrated in FIG. 3A, epitaxial growth of a release layer 201 is performed on a mother substrate 200 formed from a single crystal of a compound semiconductor such as GaAs, and thereby an element forming layer 202 is formed on the release layer 201. The element forming layer 202 has element structures formed therein and including the foundation semiconductor layer 40, the plurality of first transistors 41, the first emitter electrode 42E, the first base electrode 42B, the interlayer dielectric 80, the first emitter wire 81E, and the like that are illustrated in FIG. 2. These element structures are formed by a general semiconductor process. The element structures formed in the element forming layer 202 are omitted in FIG. 3A. At this stage, the element structures corresponding to the plurality of semiconductor devices have been formed in the element forming layer 202 but have not been isolated as individual semiconductor devices. In addition, the first emitter pad 82E, the first conductor protrusion 83E, and the solder 84 (FIG. 2) have not been formed.

Figure 3B:
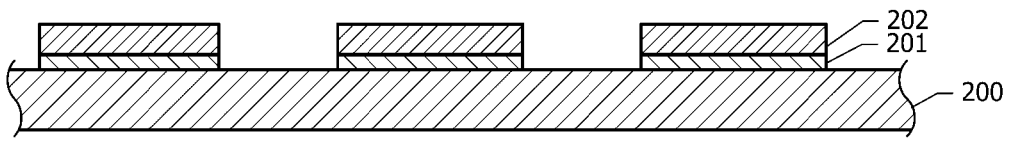

Subsequently, as illustrated in FIG. 3B, patterning is performed on the element forming layer 202 and the release layer 201 by using a resist pattern (not illustrated) as an etching mask. At this stage, the element forming layer 202 is separated for isolation for each semiconductor device.

Figure 3C:
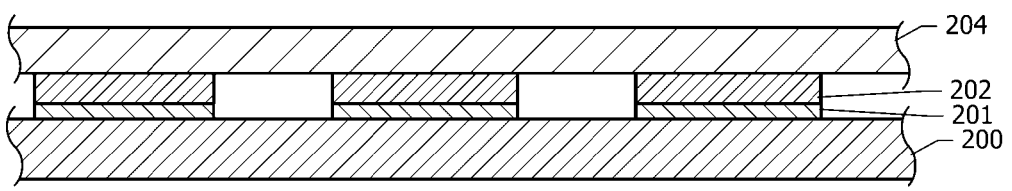

Subsequently, as illustrated in FIG. 3C, an interconnection support 204 is attached to the isolated element forming layers 202. This causes the plurality of element forming layers 202 to be interconnected to each other by using the interconnection support 204. Note that the resist pattern used as the etching mask in the patterning process in FIG. 3B may be left to be interposed between each of the element forming layers 202 and the interconnection support 204.

Figure 3D:
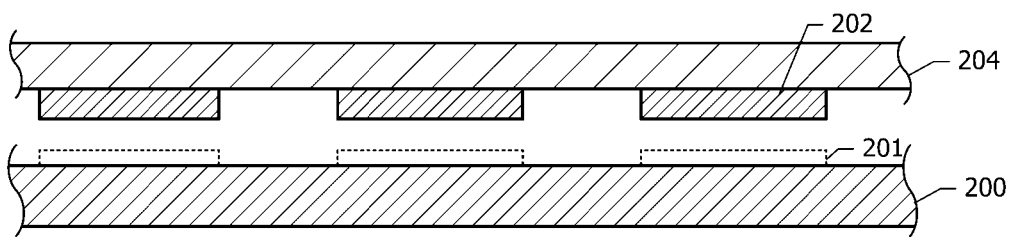

Subsequently, as illustrated in FIG. 3D, the release layer 201 is selectively etched for the mother substrate 200 and the element forming layer 202. The element forming layer 202 and the interconnection support 204 are released from the mother substrate 200. To selectively etch the release layer 201, a compound semiconductor having etching resistance different from that of each of the mother substrate 200 and the element forming layer 202 is used as the release layer 201.

Figure 3E:
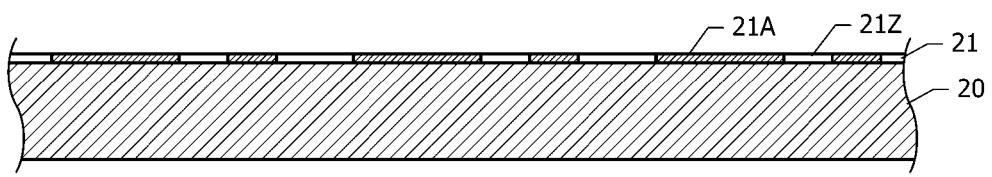

As illustrated in FIG. 3E, the bond layer 21 is formed on the upper surface of the substrate 20. The bond layer 21 includes: the plurality of first metal regions 21A dispersed within the plane of the substrate 20; and insulating regions 21Z assigned to regions not having the first metal regions 21A. The bond layer 21 can be formed, for example, by a damascene process.

Figure 3F:
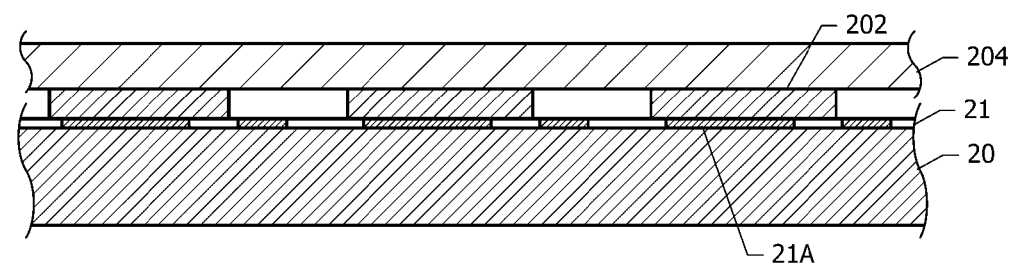

As illustrated in FIG. 3F, the element forming layers 202 are bonded to the bond layer 21. The element forming layers 202 are bonded to the bond layer 21 by using a van der Waals bond or a hydrogen bond. In addition to these, an electrostatic force, a covalent bond, eutectic alloy bonding, or the like may be used to bond the element forming layers 202 to the bond layer 21. For example, if the first metal regions 21A are formed from Au, the element forming layers 202 and the bond layer 21 may be bonded together in such a manner that the element forming layers 202 are pressed against the Au film in close contact with each other.

Figure 4A:
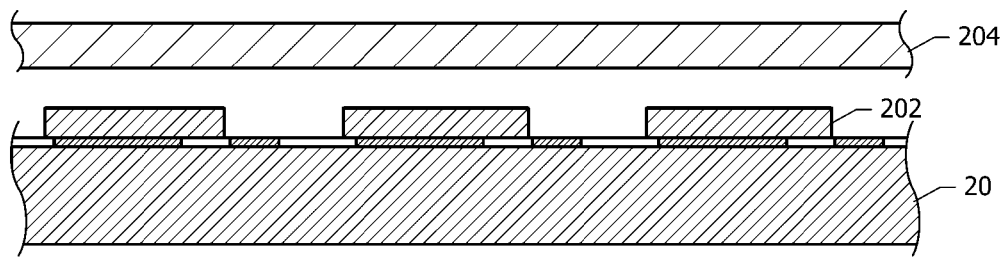
FIGS. 4A to 4C are each a schematic cross-sectional view of the semiconductor device in the course of manufacturing.
Figure 4B:
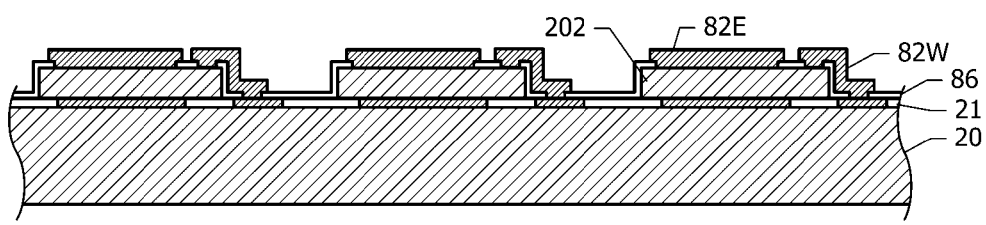

Subsequently, as illustrated in FIG. 4A, the interconnection support 204 is released from the element forming layers 202. As illustrated in FIG. 4B, after the interconnection support 204 is released, interlayer dielectrics 86 and re-wiring layers are formed on the bond layer 21 and the element forming layers 202. Each re-wiring layer includes: the first emitter pad 82E disposed on the first emitter wire 81E (FIG. 2); a mutual coupling wire 82W coupling a circuit included in the corresponding element forming layer 202 and a metal region of the bond layer 21; and the like.

Figure 4C:
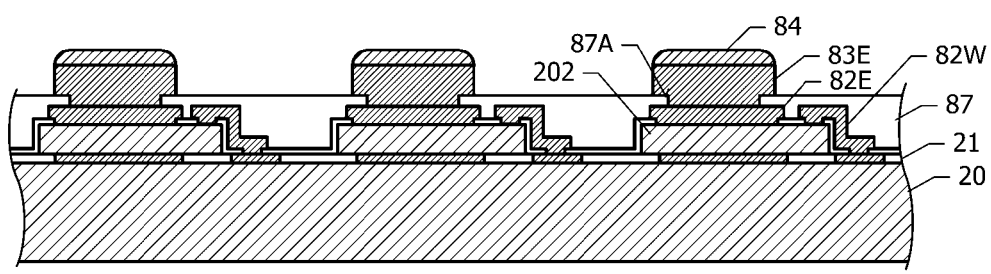
Figure 4D:
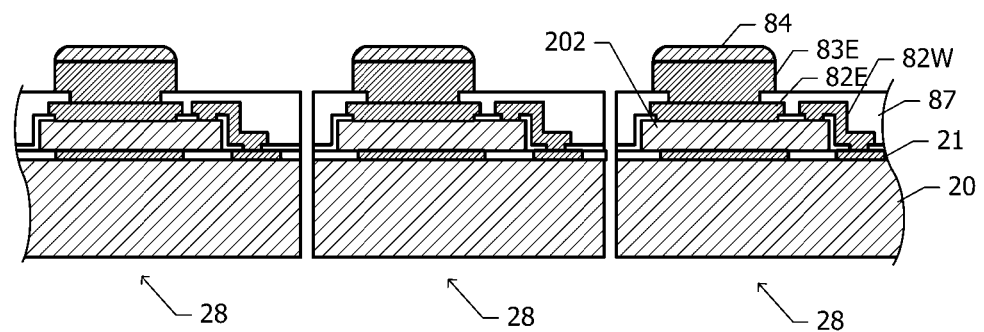
FIG. 4D is a schematic cross-sectional view of the completed semiconductor device.

Subsequently, as illustrated in FIG. 4C, a protective film 87 is formed on the re-wiring layers, and a plurality of cavities 87A are formed in the protective film 87. In a plan view, each of the plurality of cavities 87A is included in a corresponding one of the plurality of first emitter pads 82E. The first conductor protrusions 83E are each formed in the corresponding cavity 87A and on the protective film 87. Each first conductor protrusion 83E protrudes in a direction of going away from the substrate 20. Further, the solder 84 is placed on top of the first conductor protrusion 83E, and a reflow process is performed.

Finally, as illustrated in FIG. 4D, the substrate 20 is cut with a dicing machine. This provides semiconductor devices 28 resulting from the separation into pieces and each including the substrate 20, the bond layer 21, the element forming layer 202, the first emitter pad 82E, the first conductor protrusion 83E, the mutual coupling wire 82W, and the like. Regarding the separated semiconductor devices 28, each substrate 20 is larger than the corresponding element forming layer 202 in the plan view. Flip-chip mounting of each separated semiconductor device 28 is performed on the module substrate or the like.

Advantageous effects of the first embodiment will then be described.

In the first embodiment, heat generated from the first transistor 41 (FIG. 2) is conducted to the substrate 20 via the foundation semiconductor layer 40 and the bond layer 21 and also conducted to the solder 84 via the first emitter electrode 42E, the first emitter wire 81E, the first emitter pad 82E, and the first conductor protrusion 83E. The heat conducted to the solder 84 is conducted to the module substrate having the semiconductor device mounted thereon and the like. The heat conducted to the substrate 20 is diffused in the substrate 20 and thereafter radiated to the outside. The heat conducted to the module substrate is likewise radiated from the module substrate to the outside.

As described above, the heat generated from the first transistor 41 is conducted in both directions, that is, downwards (toward the substrate 20) and upwards (toward the first conductor protrusion 83E) and is radiated. Accordingly, compared with a case where heat is conducted in one direction, the characteristics of heat radiation from the first transistor 41 can be improved. The improvement of the characteristics of heat radiation from the first transistor 41 enables the plurality of first transistors 41 to be laid out closely. The semiconductor device can thereby be downsized.

To sufficiently diffuse, in the substrate 20, the heat conducted to the substrate 20, a material having thermal conductivity higher than the thermal conductivity of each of the collector layer 41C, the base layer 41B, and the emitter layer 41E of the first transistor 41 is preferably used as the semiconductor material of the surface layer portion of the substrate 20. Examples of such a semiconductor material include silicon. In addition, to efficiently radiate the heat from the substrate 20 to the outside, a configuration in which the substrate 20 is larger than the foundation semiconductor layer 40 in the plan view is preferably employed.

Subsequently, with reference to FIGS. 5A and 5B, further advantageous effects of the first embodiment will be described compared with a comparative example.

Figure 5A:
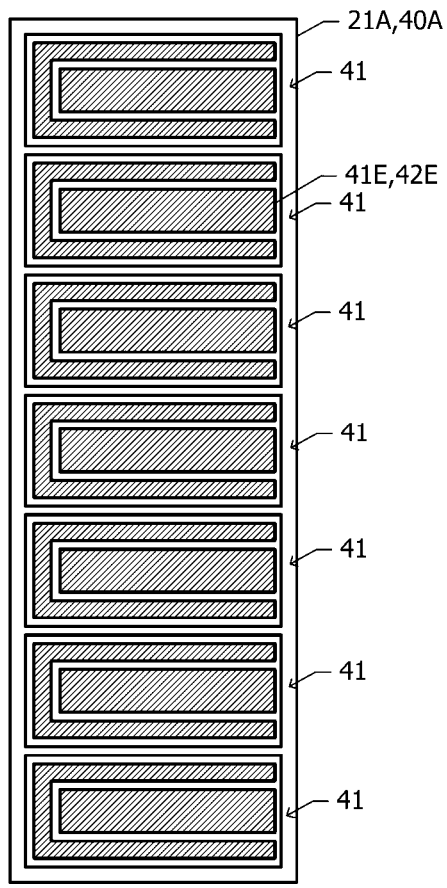
FIG. 5A is a schematic plan view of the semiconductor device according to the first embodiment.

FIG. 5A is a schematic plan view of the semiconductor device according to the first embodiment and is the same as the schematic plan view illustrated in FIG. 1. FIG. 5B is a schematic plan view of a semiconductor device according to the comparative example.

In the semiconductor device according to the comparative example, the bond layer 21 (FIG. 2) including the first metal region 21A is not provided, and first collector electrodes 42C are each disposed between the mutually adjacent two first transistors 41. Each first collector electrode 42C is disposed on the first conducting region 40A of the foundation semiconductor layer 40 (FIG. 2) and is electrically coupled to the corresponding collector layer 41C (FIG. 2) of the first transistor 41 by using the first conducting region 40A. In contrast, in the first embodiment, the first metal region 21A (FIG. 2) of the bond layer 21 functions as a collector electrode.

Since a space for disposing the first collector electrode 42C (FIG. 5B) in the plan view does not need to be secured in the first embodiment, the semiconductor device can be downsized.

Figure 5B:
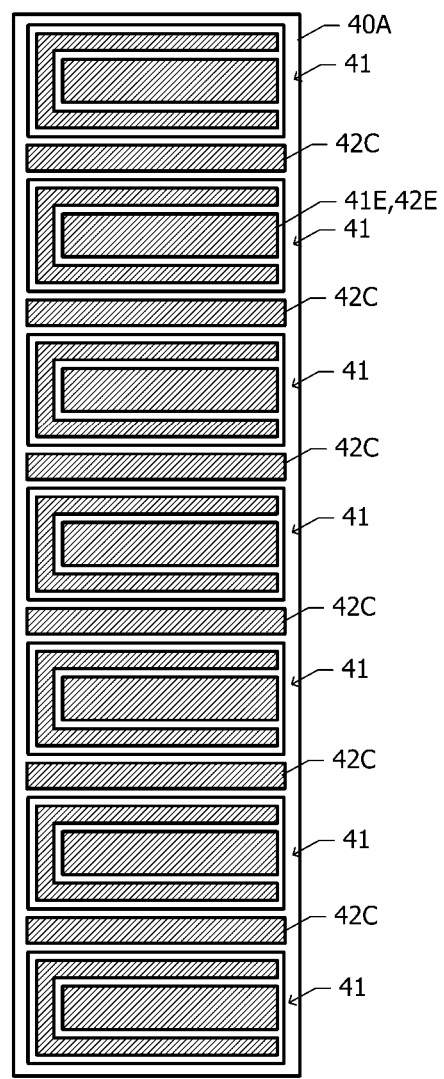
FIG. 5B is a schematic plan view of a semiconductor device according to a comparative example.

In the comparative example illustrated in FIG. 5B, a distance from the edge of the emitter layer 41E to the first collector electrode 42C is not equal to a distance from a deep inner portion of the emitter layer 41E to the first collector electrode 42C, and there is variation in distance depending on the location on the plane of the semiconductor device. In contrast, in the first embodiment, a distance in the thickness direction between the emitter layer 41E and the first metal region 21A functioning as the collector electrode is constant regardless of the location on the plane. This enables uniform operations on the plane of the emitter layer 41E.

A modification of the first embodiment will then be described with reference to FIG. 6.

Figure 6:
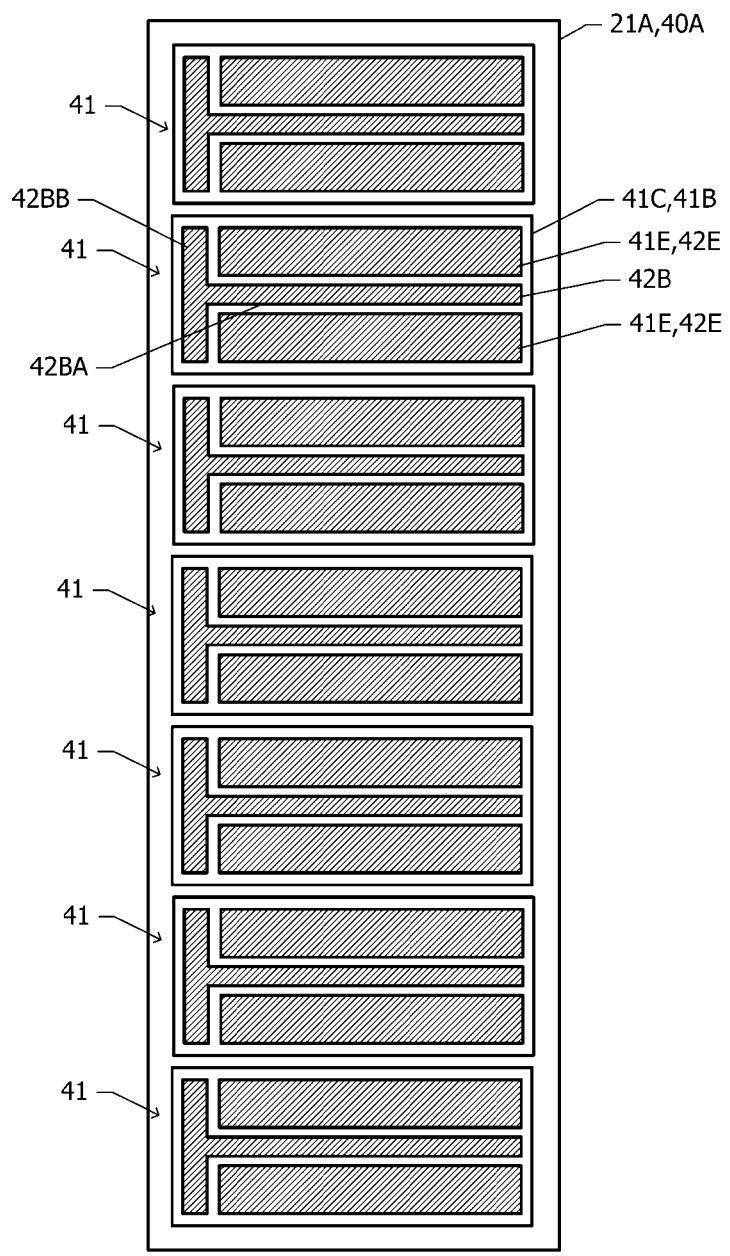
FIG. 6 is a schematic plan view of a semiconductor device according to a modification of the first embodiment.

FIG. 6 is a schematic plan view of a semiconductor device according to the modification of the first embodiment. In the first embodiment (FIG. 1), each first transistor 41 includes one emitter layer 41E and one first emitter electrode 42E. In contrast, in the modification illustrated in FIG. 6, each first transistor 41 includes two emitter layers 41E, and two first emitter electrodes 42E are disposed for each first transistor 41. The two first emitter electrodes 42E are arranged in parallel in a direction orthogonal to the longitudinal direction of each first emitter electrode 42E.

In the plan view, each of main portions 42BA of the respective first base electrodes 42B is disposed between the two first emitter electrodes 42E. A contact portion 42BB extending in the width direction of the first emitter electrode 42E is provided at one end of the main portion 42BA of the first base electrode 42B. In the contact portion 42BB, the first base electrode 42B is coupled to a base wire (not illustrated) on the upper layer.

Also in this modification, like the first embodiment, the characteristics of heat radiation from the first transistor 41 can be improved, and the semiconductor device can be downsized as a further advantageous effect.

Other modifications of the first embodiment will then be described.

In the first embodiment, the first conducting region 40A (FIG. 1) is surrounded by the element isolating region that is insulated; however, the element isolating region does not have to be provided, and the entire region of the foundation semiconductor layer 40 (FIG. 2) may serve as the first conducting region 40A. The plurality of first transistors 41 are provided in the first embodiment, but only one first transistor 41 may be provided. In addition, as illustrated in FIG. 2, the foundation semiconductor layer 40 is disposed between the bond layer 21 and the first transistor 41 in the first embodiment, but the foundation semiconductor layer 40 may be omitted. In this case, the collector layer 41C of the first transistor 41 is directly bonded to the first metal region 21A of the bond layer 21. The interlayer dielectric 80 is also directly bonded to the bond layer 21.

Second Embodiment

A semiconductor device according to a second embodiment will then be described with reference to FIGS. 7 and 8. Hereinafter, the explanation of a configuration common to that of the semiconductor device according to the first embodiment described with reference to FIGS. 1 to 4D is omitted.

Figure 7:
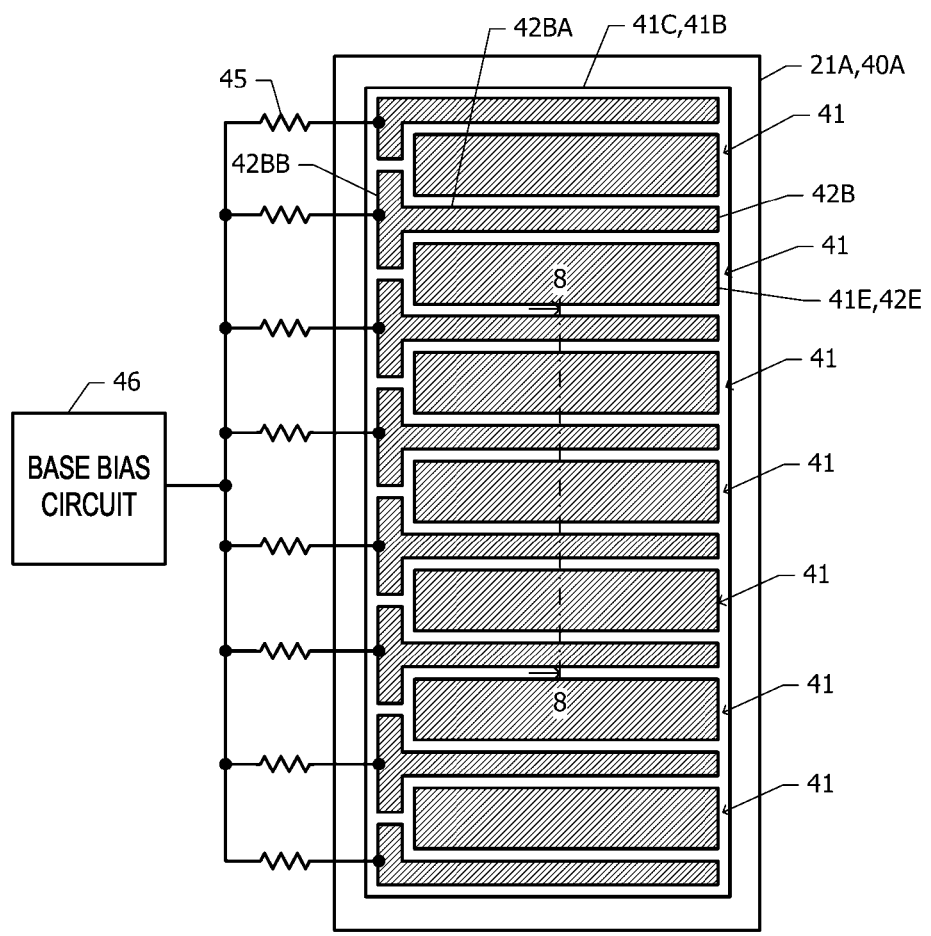
FIG. 7 is a schematic plan view of a semiconductor device according to a second embodiment.
Figure 8:
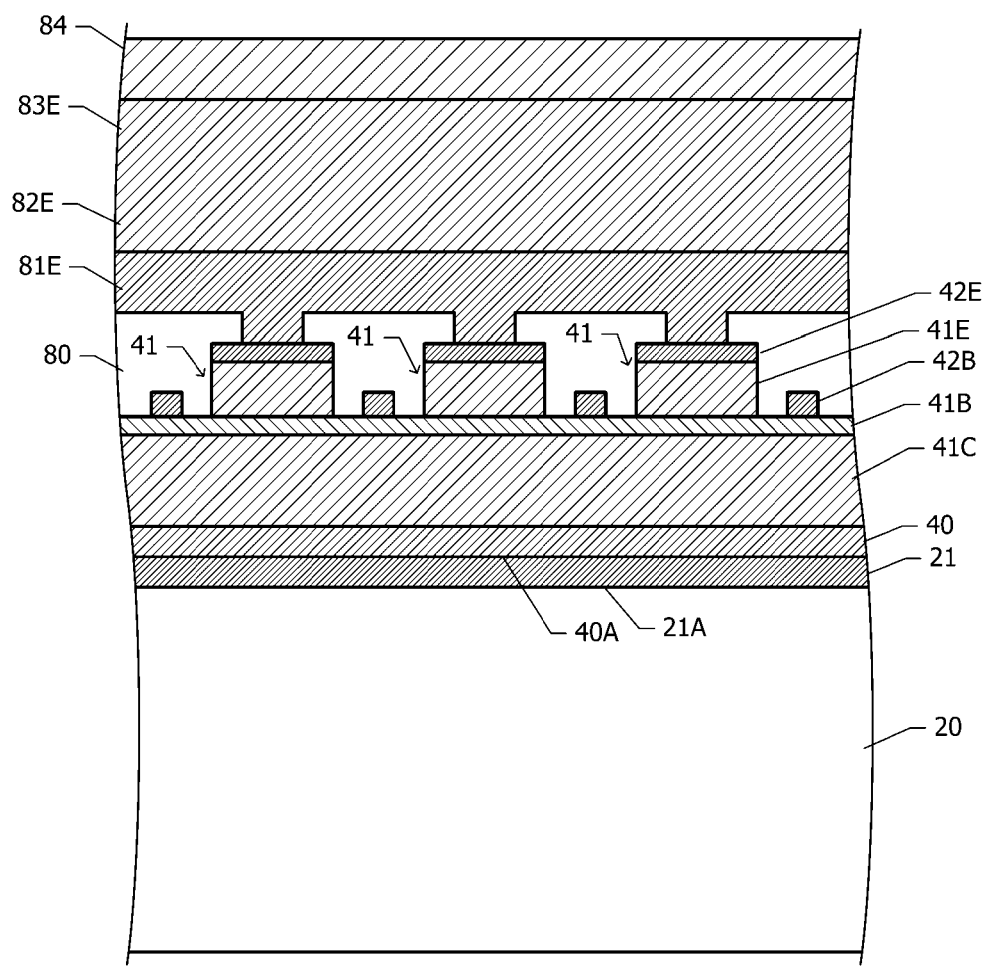
FIG. 8 is a cross-sectional view taken along an alternate long and short dash line 8-8 in FIG. 7.

FIG. 7 is a schematic plan view of the semiconductor device according to the second embodiment. FIG. 8 is a cross-sectional view taken along the alternate long and short dash line 8-8 in FIG. 7. In FIG. 7, each first emitter electrode 42E and each first base electrode 42B are hatched. In the first embodiment (FIGS. 1 and 2), each collector layer 41C and each base layer 41B are isolated on the basis of the first transistor 41. In contrast, in the second embodiment, a series of arrangements of the collector layer 41C and the base layer 41B extends over the plurality of first transistors 41. Note that in the definition in the second embodiment, a first transistor 41 is composed of an emitter layer 41E, a base layer 41B, and a collector layer 41C, the base layer 41B and the collector layer 41C being directly below the emitter layer 41E.

The main portion 42BA of the first base electrode 42B is disposed between the mutually adjacent two first emitter electrodes 42E. The contact portion 42BB extending in the width direction of the first emitter electrode 42E is provided at one end of the main portion 42BA of the first base electrode 42B. One first base electrode 42B is shared by the two first transistors 41 respectively coupled to the two first emitter electrodes 42E on both sides of the first base electrode 42B. Each of the plurality of first base electrodes 42B is coupled to a base bias circuit 46 with a corresponding one of base ballast resistors 45 interposed therebetween.

Advantageous effects of the second embodiment will then be described.

In the first embodiment, the two first base electrodes 42B are disposed between the mutually adjacent two first emitter electrodes 42E. In contrast, in the second embodiment, one first base electrode 42B is disposed between the mutually adjacent two first emitter electrodes 42E. Accordingly, the semiconductor device can be downsized compared with the first embodiment. In addition, if the semiconductor devices according to the respective first and second embodiments have the same size and the same number of first transistors 41, the total area of the collector-base bonding interfaces of the respective semiconductor devices according to the second embodiment is smaller than the total area of the collector-base bonding interfaces of the respective semiconductor devices according to the first embodiment. This provides an advantageous effect that reduces parasitic capacitance between the base and the collector.

A modification of the second embodiment will then be described.

In the second embodiment, the plurality of first base electrodes 42B each disposed between the mutually adjacent two first emitter electrodes 42E are isolated from each other, and each base ballast resistor 45 is coupled to a corresponding one of the plurality of first base electrodes 42B. If there are variations in collector current among the plurality of first transistors 41, thermal runaway occurs on a specific first transistor 41 having higher collector current in some cases. The base ballast resistor 45 has a function of levelling the variations in the collector current and preventing the thermal runaway. Nevertheless, some first transistors 41 do not easily reach thermal runaway on occasions, depending on the operating condition of the first transistors 41. In such a case, the plurality of first base electrodes 42B may be mutually serially arranged, and one base ballast resistor 45 may be coupled to the plurality of first base electrodes 42B.

Third Embodiment

A semiconductor device according to a third embodiment will then be described with reference to FIG. 9. Hereinafter, explanation of a configuration common to that of the semiconductor device according to the first embodiment described with reference to FIGS. 1 to 4D is omitted.

Figure 9:
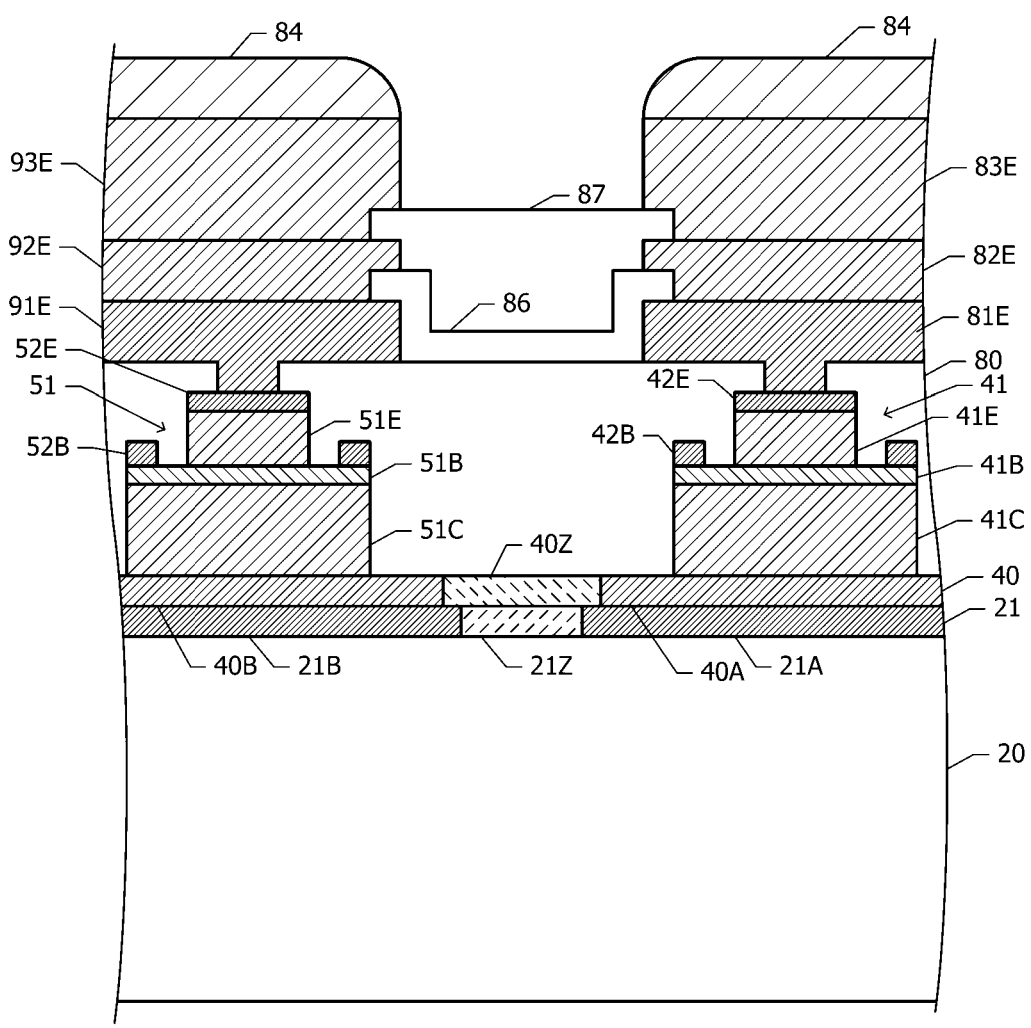
FIG. 9 is a cross-sectional view of a semiconductor device according to a third embodiment.

FIG. 9 is a cross-sectional view of the semiconductor device according to the third embodiment. The semiconductor device according to the first embodiment (FIGS. 1 and 2) includes the plurality of first transistors 41 as semiconductor elements. In contrast, in the semiconductor device according to the third embodiment, a plurality of semiconductor elements disposed above the substrate 20 include second transistors 51 in addition to the first transistors 41.

The bond layer 21 includes a second metal region 21B as a metal region in addition to the first metal region 21A. The first metal region 21A and the second metal region 21B are isolated from each other by the insulating region 21Z included in the bond layer 21. The foundation semiconductor layer 40 includes a second conducting region 40B as a conducting region in addition to the first conducting region 40A. The first conducting region 40A and the second conducting region 40B are isolated from each other by an element isolating region 40Z included in the foundation semiconductor layer 40. In a plan view, the first conducting region 40A and the first metal region 21A have a mutually overlapping region. Likewise, the second conducting region 40B and the second metal region 21B have a mutually overlapping region. Further, in the plan view, the element isolating region 40Z and the insulating region 21Z overlap with each other at least partially in such a manner that a region composed of the first conducting region 40A and the first metal region 21A and a region composed of the second conducting region 40B and the second metal region 21B are electrically insulated from each other.

Each second transistor 51 is disposed on the second conducting region 40B. Like each first transistor 41, the second transistor 51 includes a collector layer 51C, a base layer 51B, and an emitter layer 51E. The second metal region 21B functions as the collector electrode of the second transistor 51. A second base electrode 52B is coupled to the base layer 51B, and a second emitter electrode 52E is coupled to the emitter layer 51E.

A second emitter wire 91E, a second emitter pad 92E, and a second conductor protrusion 93E are disposed above the second emitter electrode 52E. The solder 84 is put on the second conductor protrusion 93E. Like the first emitter pad 82E, the second emitter pad 92E is included in the re-wiring layer (FIG. 4B). The interlayer dielectric 86 is disposed between the first emitter wire 81E and the second emitter wire 91E and between the re-wiring layers. The first emitter pad 82E and the second emitter pad 92E are covered with the protective film 87 except regions respectively coupled to the first conductor protrusion 83E and the second conductor protrusion 93E.

An advantageous effect of the third embodiment will then be described.

In the third embodiment, the first transistor 41 and the second transistor 51 that are electrically isolated from each other are formed above the shared substrate 20. Two amplifier circuits can thus be included in one semiconductor device. For example, a two-stage amplifier circuit can be achieved in such a manner that an anterior amplifier circuit and a posterior amplifier circuit are respectively configured by using the second transistor 51 and the first transistor 41. Also in the third embodiment, like the first embodiment, the improvement of the heat radiation characteristics can be achieved.

Fourth Embodiment

A semiconductor device according to a fourth embodiment will then be described with reference to FIGS. 10, 11A, and 11B. Hereinafter, explanation of a configuration common to that of the semiconductor device according to the first embodiment described with reference to FIGS. 1 to 4D is omitted.

Figure 10:
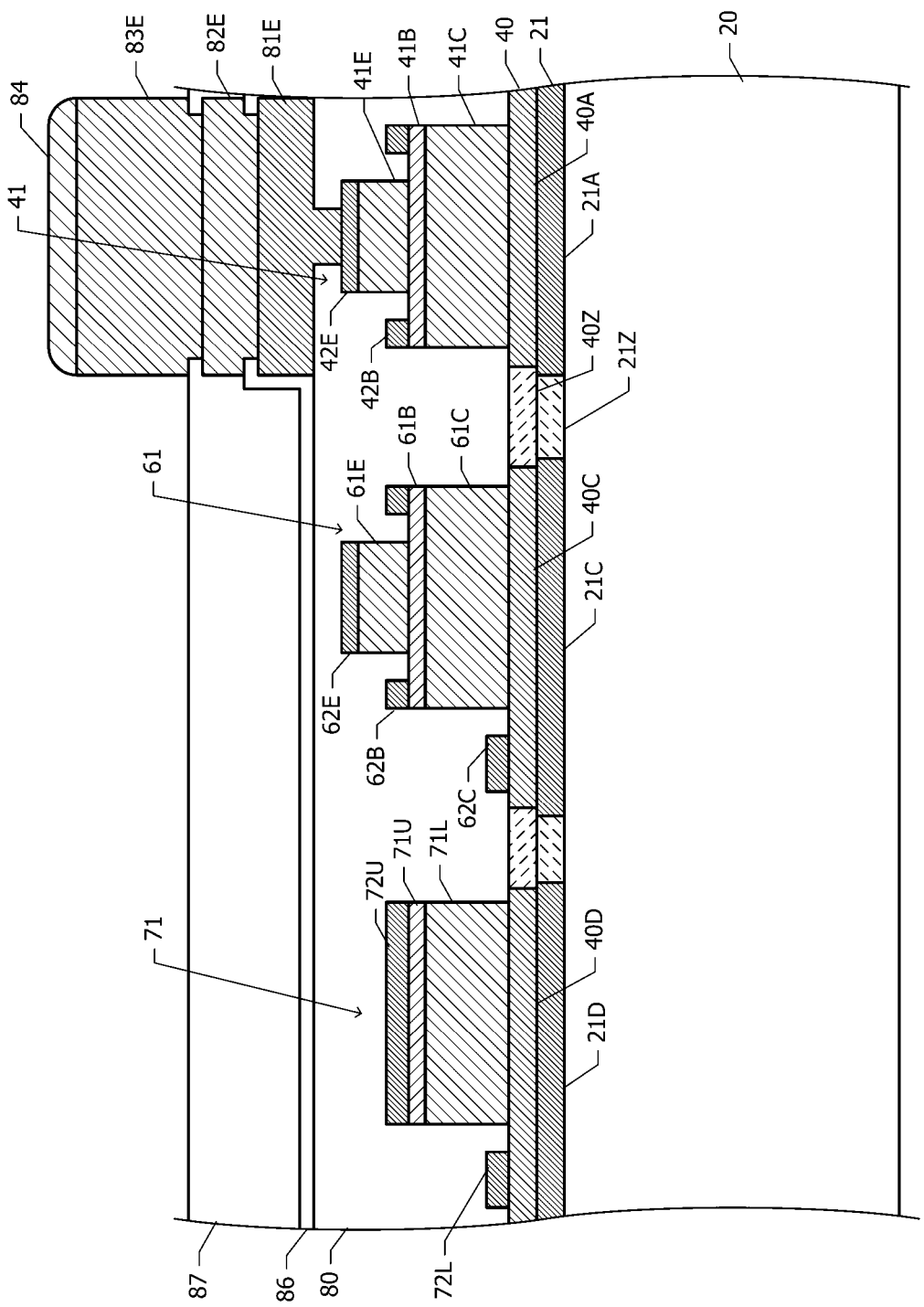
FIG. 10 is a cross-sectional view of a semiconductor device according to a fourth embodiment.

FIG. 10 is a cross-sectional view of the semiconductor device according to the fourth embodiment. In the semiconductor device according to the fourth embodiment, a plurality of semiconductor elements disposed on the substrate 20 each include a third transistor 61 and a diode 71 in addition to the first transistor 41.

The bond layer 21 includes, as metal regions, a third metal region 21C and a fourth metal region 21D in addition to the first metal region 21A. The first metal region 21A, the third metal region 21C, and the fourth metal region 21D are isolated from each other by the insulating regions 21Z. The foundation semiconductor layer 40 includes a third conducting region 40C and a fourth conducting region 40D in addition to the first conducting region 40A. The first conducting region 40A, the third conducting region 40C, and the fourth conducting region 40D are isolated from each other by the element isolating regions 40Z. The first metal region 21A, the third metal region 21C, and the fourth metal region 21D respectively overlap with the first conducting region 40A, the third conducting region 40C, and the fourth conducting region 40D at least partially in a plan view. Each insulating region 21Z overlaps with the corresponding element isolating region 40Z at least partially in the plan view in such a manner that three regions, that is, a region composed of the first conducting region 40A and the first metal region 21A, a region composed of the second conducting region 40B and the second metal region 21B, and a region composed of the third conducting region 40C and the third metal region 21C are electrically insulated from each other.

The third transistor 61 is disposed on the third conducting region 40C. The third transistor 61 includes a collector layer 61C, a base layer 61B, and an emitter layer 61E, like the first transistor 41. A third base electrode 62B is coupled to the base layer 61B, and a third emitter electrode 62E is coupled to the emitter layer 61E.

In the plan view, a third collector electrode 62C is disposed in the inner side portion of each of the third conducting region 40C and the third metal region 21C and in the outer side portion of the third transistor 61. The third collector electrode 62C is electrically coupled to the collector layer 61C of the third transistor 61 by using the third conducting region 40C and the third metal region 21C. A conductor protrusion for the third transistor 61 is not provided. It suffices that the third collector electrode 62C is disposed in the inner side portion of the third conducting region 40C in the plan view, and the third collector electrode 62C does not necessarily have to be disposed in the inner side portion of the third metal region 21C. In addition, if a configuration in which the third metal region 21C and the third conducting region 40C are directly coupled to a different electronic device or the like is employed, the third collector electrode 62C may be omitted. For example, by using the third metal region 21C and the third conducting region 40C, the collector layer 61C of the third transistor 61 may be coupled to a different electron device disposed above the substrate 20 or a different electron device disposed above the foundation semiconductor layer 40.

The diode 71 is disposed on the fourth conducting region 40D. The diode 71 includes a lower layer 71L of a first conductor type (for example, an n-type) coupled to the fourth conducting region 40D and an upper layer 71U that is disposed on the lower layer 71L and is of a second conductor type (for example, a p-type) opposite from the first conductor type. The lower layer 71L is formed together with the collector layer 41C of the first transistor 41 and the collector layer 61C of the third transistor 61 by performing patterning of a shared semiconductor layer. Likewise, the upper layer 71U is formed together with the base layer 41B of the first transistor 41 and the base layer 61B of the third transistor 61 by performing patterning of a shared semiconductor layer.

In the plan view, a lower electrode 72L is disposed in the inner side portion of each of the fourth conducting region 40D and the fourth metal region 21D and in the outer side portion of the diode 71. The lower electrode 72L is electrically coupled to the lower layer 71L by using the fourth conducting region 40D and the fourth metal region 21D. It suffices that the lower electrode 72L is disposed in the inner side portion of the fourth conducting region 40D in the plan view, and the lower electrode 72L does not necessarily have to be disposed in the inner side portion of the fourth metal region 21D. An upper electrode 72U is disposed on the upper layer 71U. The upper electrode 72U is electrically coupled to the upper layer 71U. Note that if a configuration in which the fourth metal region 21D and the fourth conducting region 40D are directly coupled to a different electronic device or the like is employed, the lower electrode 72L may be omitted. For example, by using the fourth metal region 21D and the fourth conducting region 40D, the lower layer 71L of the diode 71 may be coupled to a different electron device above the substrate 20 or a different electron device disposed above the foundation semiconductor layer 40.

Advantageous effects of the fourth embodiment will then be described.

Also in the fourth embodiment, like the first embodiment, the improvement of the characteristics of heat radiation from the first transistor 41 can be achieved. Further, the semiconductor device according to the fourth embodiment includes the third transistor 61 in addition to the first transistor 41, the third transistor 61 including the third collector electrode 62C disposed on the foundation semiconductor layer 40, the first transistor 41 including the first metal region 21A disposed below the foundation semiconductor layer 40 and functioning as the collector electrode. This provides an advantageous effect that makes higher the degree of freedom in designing a wire coupled to the collector of a transistor and thus that leads to easier circuit designing.

An example electronic circuit using the semiconductor device according to the fourth embodiment will then be described with reference to FIGS. 11A and 11B.

Figure 11A:
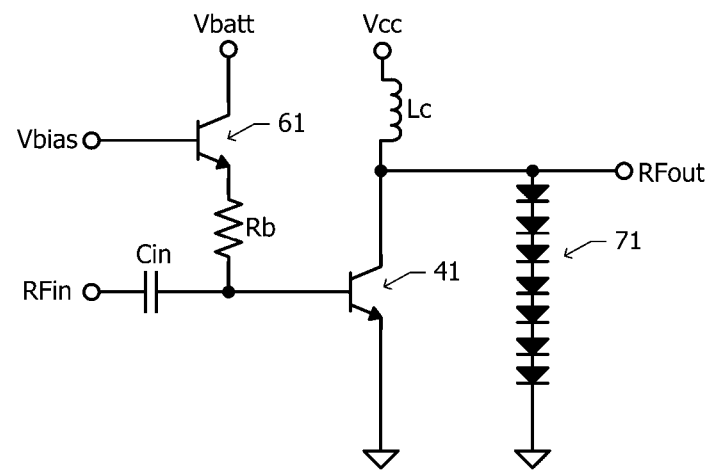
FIG. 11A is an equivalent circuit diagram illustrating an example electronic circuit using the semiconductor device according to the fourth embodiment.

FIG. 11A is an equivalent circuit diagram illustrating an example electronic circuit using the semiconductor device according to the fourth embodiment. The first transistor 41 is used to configure a power-stage amplifier circuit. A power supply voltage is applied to the collector of the first transistor 41 from a power supply terminal Vcc via a choke coil Lc.

The base bias circuit of the first transistor 41 includes the third transistor 61. The emitter of the third transistor 61 is coupled to the base of the first transistor 41 with a base ballast resistor Rb interposed therebetween. The collector and the base of the third transistor 61 are respectively coupled to a bias control port Vbias and a bias power supply port Vbatt. The base bias is supplied from the bias power supply port Vbatt to the first transistor 41 through the third transistor 61 and the base ballast resistor Rb in accordance with control current applied to the bias control port Vbias.

A radio frequency signal is input from an input port RFin to the base of the first transistor 41 through an input capacitor Cin. The emitter of the first transistor 41 is grounded, and the collector thereof is coupled to an output port RFout.

The collector of the first transistor 41 is grounded with the plurality of serially coupled diodes 71 interposed between the collector and the ground. The plurality of diodes 71 are coupled, have a polarity corresponding to a forward direction from the collector of the first transistor 41 toward the ground potential, and function as clamp diodes.

Figure 11B:
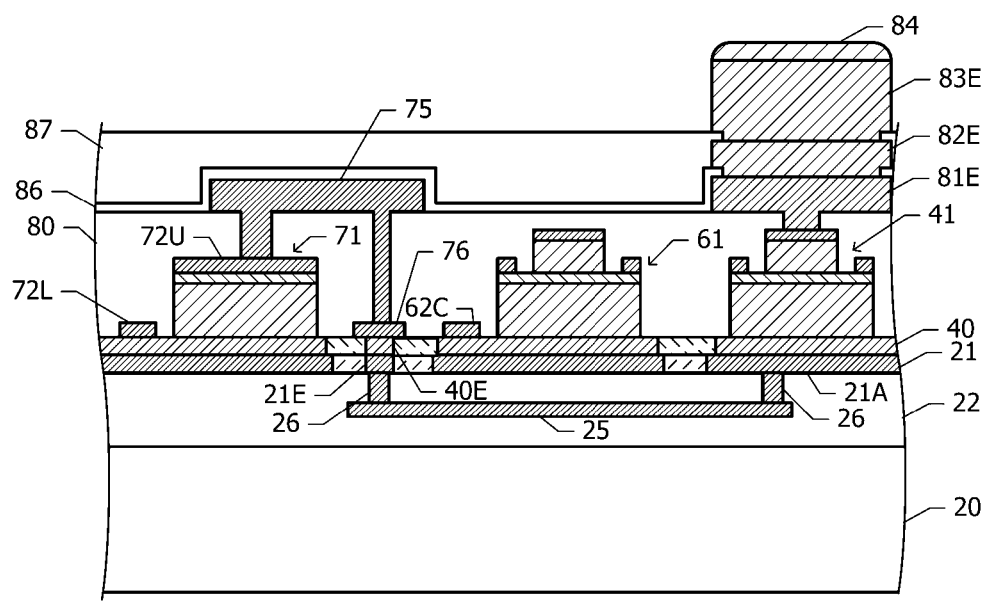
FIG. 11B is a partial cross section of a semiconductor device to implement the electronic circuit illustrated in FIG. 11A.

FIG. 11B is a partial cross section of a semiconductor device to implement the electronic circuit illustrated in FIG. 11A. Hereinafter, a difference from the structure illustrated in FIG. 10 will be described. The bond layer 21 includes a fifth metal region 21E, and the foundation semiconductor layer 40 includes a fifth conducting region 40E. A pad 76 is disposed on the fifth conducting region 40E. The fifth metal region 21E and the fifth conducting region 40E overlap with each other in a plan view. The pad 76 is electrically coupled to the fifth metal region 21E with the fifth conducting region 40E interposed therebetween.

A wire 75 in addition to the first emitter wire 81E is disposed on the interlayer dielectric 80. The wire 75 is coupled to the upper electrode 72U and the pad 76 through a cavity provided in the interlayer dielectric 80. A multi-layer wiring structure 22 is disposed between the substrate 20 and the bond layer 21. The multi-layer wiring structure 22 includes a wire 25 and a plurality of vias 26. The upper electrode 72U of the diode 71 is electrically coupled to the first metal region 21A functioning as the collector electrode of the first transistor 41, by using the wire 75, the pad 76, the fifth conducting region 40E, the fifth metal region 21E, and the wire 25 and the vias 26 in the multi-layer wiring structure 22. Note that the upper electrode 72U may be coupled to the first metal region 21A by extending the fifth metal region 21E to the first metal region 21A in such a manner that the fifth metal region 21E by-passes the third transistor 61 in the bond layer 21. If this configuration is employed, the multi-layer wiring structure 22 may be omitted.

FIG. 11B illustrates an example in which the one-layer wiring layer including the first emitter wire 81E is disposed between the interlayer dielectric 80 and the first emitter pad 82E; however, a plurality of wiring layers may be disposed between the interlayer dielectric 80 and the first emitter pad 82E. The base ballast resistor Rb and the input capacitor Cin are formed above the foundation semiconductor layer 40, for example, before the interlayer dielectric 80 is formed.

The third collector electrode 62C of the third transistor 61 is coupled to a collector conductor protrusion (not illustrated) disposed on the protective film 87. Bias supply is supplied from the bias power supply port Vbatt (FIG. 11A) of the module substrate to the collector of the third transistor 61 via the collector conductor protrusion and the third collector electrode 62C. Since the third collector electrode 62C is disposed on the foundation semiconductor layer 40, a structure of coupling between the third collector electrode 62C and the collector conductor protrusion for coupling to the bias power supply port Vbatt can be simplified compared with a case where the collector electrode of the third transistor 61 is disposed below the foundation semiconductor layer 40.

A modification of the fourth embodiment will then be described. The wire 25 and the vias 26 are disposed in the multi-layer wiring structure 22 in the fourth embodiment; however, in a modification, a passive element formed from a metal pattern may be provided. For example, an inductor may be formed from a spiral or meandering metal pattern. Alternatively, a capacitor may be formed from metal patterns respectively provided on both sides of an interlayer dielectric.

Fifth Embodiment

A semiconductor device according to a fifth embodiment will then be described with reference to FIG. 12. Hereinafter, explanation of a configuration common to that of the semiconductor device according to the first embodiment described with reference to FIGS. 1 to 4D is omitted.

Figure 12:
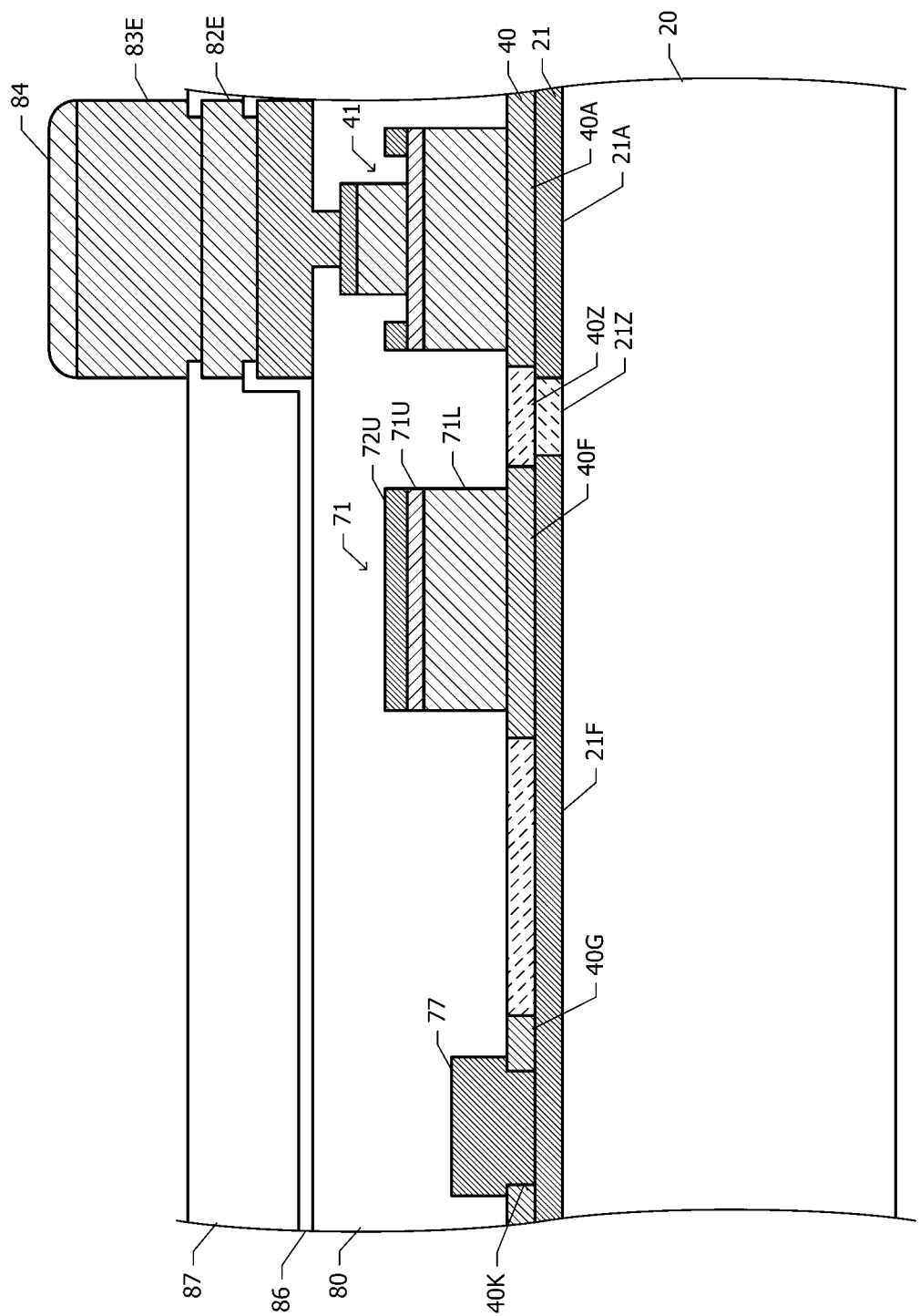
FIG. 12 is a cross-sectional view of a semiconductor device according to a fifth embodiment.

FIG. 12 is a cross-sectional view of the semiconductor device according to the fifth embodiment. In the fifth embodiment, the bond layer 21 includes a sixth metal region 21F as a metal region in addition to the first metal region 21A. The foundation semiconductor layer 40 includes a sixth conducting region 40F and a seventh conducting region 40G as conducting regions in addition to the first conducting region 40A. The sixth conducting region 40F and the seventh conducting region 40G partially overlap with the sixth metal region 21F in a plan view and are electrically coupled to each other by using the sixth metal region 21F.

The diode 71 is disposed on the sixth conducting region 40F. The diode 71 has the same structure as that of the diode 71 (FIG. 10) of the semiconductor device according to the fourth embodiment. A metal member 77 such as a wire is disposed on the seventh conducting region 40G. The metal member 77 and is electrically coupled to the sixth metal region 21F through a cavity 40K provided in the foundation semiconductor layer 40. The metal member 77 is electrically coupled to the diode 71 by using the sixth metal region 21F and the sixth conducting region 40F. The cavity 40K is formed at the stage illustrated in FIG. 3A in the course of the manufacturing process. In a state where the release layer 201 illustrated in FIG. 3D is removed, the metal member 77 in the cavity 40K is exposed.

Advantageous effects of the fifth embodiment will then be described. Also in the fifth embodiment, like the first embodiment, the improvement of the characteristics of heat radiation from the first transistor 41 can be achieved. Further, in the fifth embodiment, the diode 71 and the metal member 77 are mutually coupled by using the sixth metal region 21F included in the bond layer 21. With the use of a metal region included in the bond layer 21 as a wire, the degree of freedom in wire designing can be made higher. In addition, since the metal member 77 is coupled to the sixth metal region 21F through the cavity 40K provided in the foundation semiconductor layer 40, resistance can be lowered compared with a configuration in which electrical coupling via the conducting region in the foundation semiconductor layer 40 is performed.

A modification of the fifth embodiment will then be described.

The metal member 77 and the diode 71 on the foundation semiconductor layer 40 are coupled by using the sixth metal region 21F of the bond layer 21 in the fifth embodiment; however, the metal member 77 may be coupled to a different semiconductor element by using the sixth metal region 21F. In addition, the metal member 77 is disposed on the seventh conducting region 40G included in the foundation semiconductor layer 40 in the fifth embodiment; however, the metal member 77 may be disposed on the element isolating region 40Z. In this case, the cavity 40K is provided in the element isolating region 40Z.

Sixth Embodiment

A semiconductor device according to a sixth embodiment will then be described with reference to FIG. 13. Hereinafter, explanation of a configuration common to that of the semiconductor device according to the fourth embodiment described with reference to FIGS. 10 to 11B is omitted.

Figure 13:
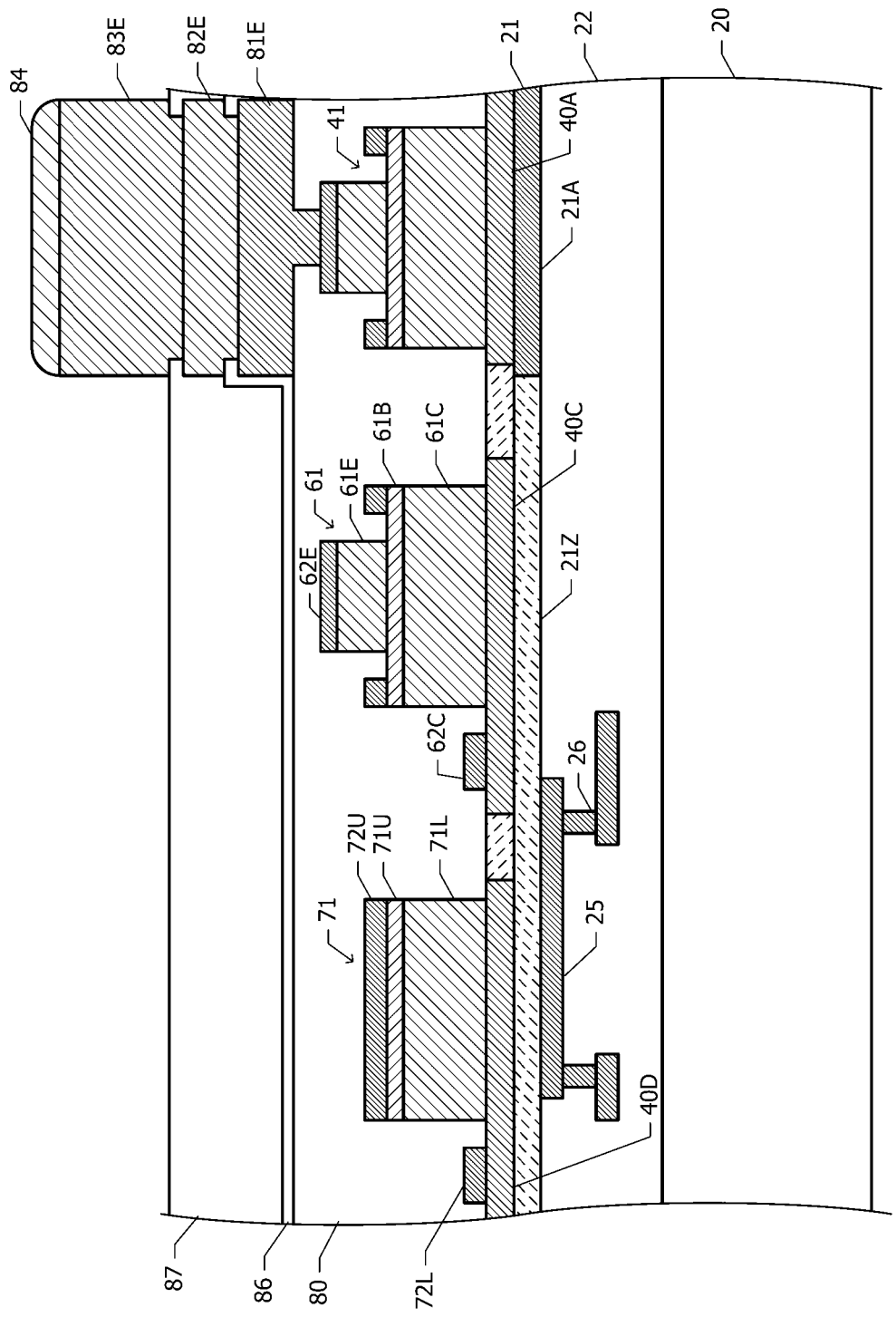
FIG. 13 is a cross-sectional view of a semiconductor device according to a sixth embodiment.

FIG. 13 is a cross-sectional view of the semiconductor device according to the sixth embodiment. In the fourth embodiment (FIG. 10), the third conducting region 40C and the fourth conducting region 40D of the foundation semiconductor layer 40 are respectively disposed on the third metal region 21C and the fourth metal region 21D of the bond layer 21. In contrast, in the sixth embodiment, the third conducting region 40C and the fourth conducting region 40D of the foundation semiconductor layer 40 are disposed on the insulating region 21Z of the bond layer 21.

In the sixth embodiment, the third collector electrode 62C is coupled to the collector layer 61C of the third transistor 61 by using only the third conducting region 40C of the foundation semiconductor layer 40. Likewise, the lower electrode 72L is coupled to the lower layer 71L of the diode 71 by using only the fourth conducting region 40D of the foundation semiconductor layer 40.

The multi-layer wiring structure 22 is disposed between the substrate 20 and the bond layer 21. The multi-layer wiring structure 22 includes the plurality of wires 25 and the plurality of vias 26.

Advantageous effects of the sixth embodiment will then be described.

Also in the sixth embodiment, like the first embodiment, the improvement of the characteristics of heat radiation from the first transistor 41 can be achieved. Further, since the insulating region 21Z is provided directly below the third conducting region 40C and the fourth conducting region 40D of the foundation semiconductor layer 40 in the sixth embodiment, the wire 25 as the topmost wiring layer in the multi-layer wiring structure 22 can be laid out in a region overlapping with the third conducting region 40C and the fourth conducting region 40D in the plan view. This provides an advantageous effect that makes higher the degree of freedom in the layout of the wire 25 in the multi-layer wiring structure 22.

Seventh Embodiment

A semiconductor device according to a seventh embodiment will then be described with reference to FIG. 14. Hereinafter, explanation of a configuration common to that of the semiconductor device according to the first embodiment described with reference to FIGS. 1 to 4D is omitted.

Figure 14:
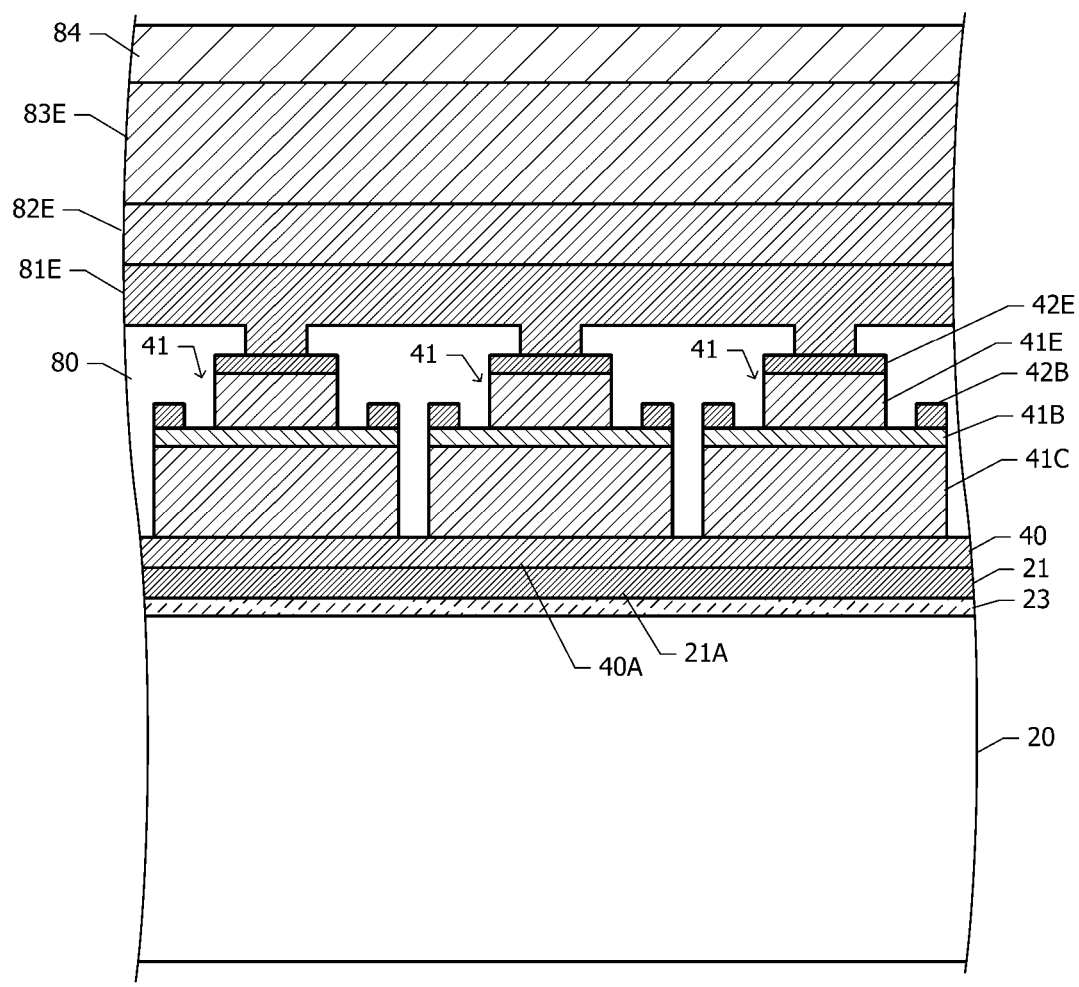
FIG. 14 is a cross-sectional view of a semiconductor device according to a seventh embodiment.

FIG. 14 is a cross-sectional view of the semiconductor device according to the seventh embodiment. In the first embodiment (FIG. 2), the substrate 20 is in contact with the bond layer 21. In contrast, in the seventh embodiment, an insulating layer 23 is disposed between the substrate 20 and the bond layer 21. An inorganic insulating material such as silicon nitride, silicon oxide, or silicon oxynitride is used for the insulating layer 23.

Advantageous effects of the seventh embodiment will then be described.

Also in the seventh embodiment, like the first embodiment, the improvement of the characteristics of heat radiation from the first transistor 41 can be achieved. Further, in the seventh embodiment, properties of insulation between a semiconductor element disposed on the foundation semiconductor layer 40, for example, the first transistor 41 and the substrate 20 can be made higher.

Eighth Embodiment

A semiconductor device according to an eighth embodiment will then be described with reference to FIG. 15. Hereinafter, explanation of a configuration common to that of the semiconductor device according to the fourth embodiment described with reference to FIG. 10 is omitted.

Figure 15:
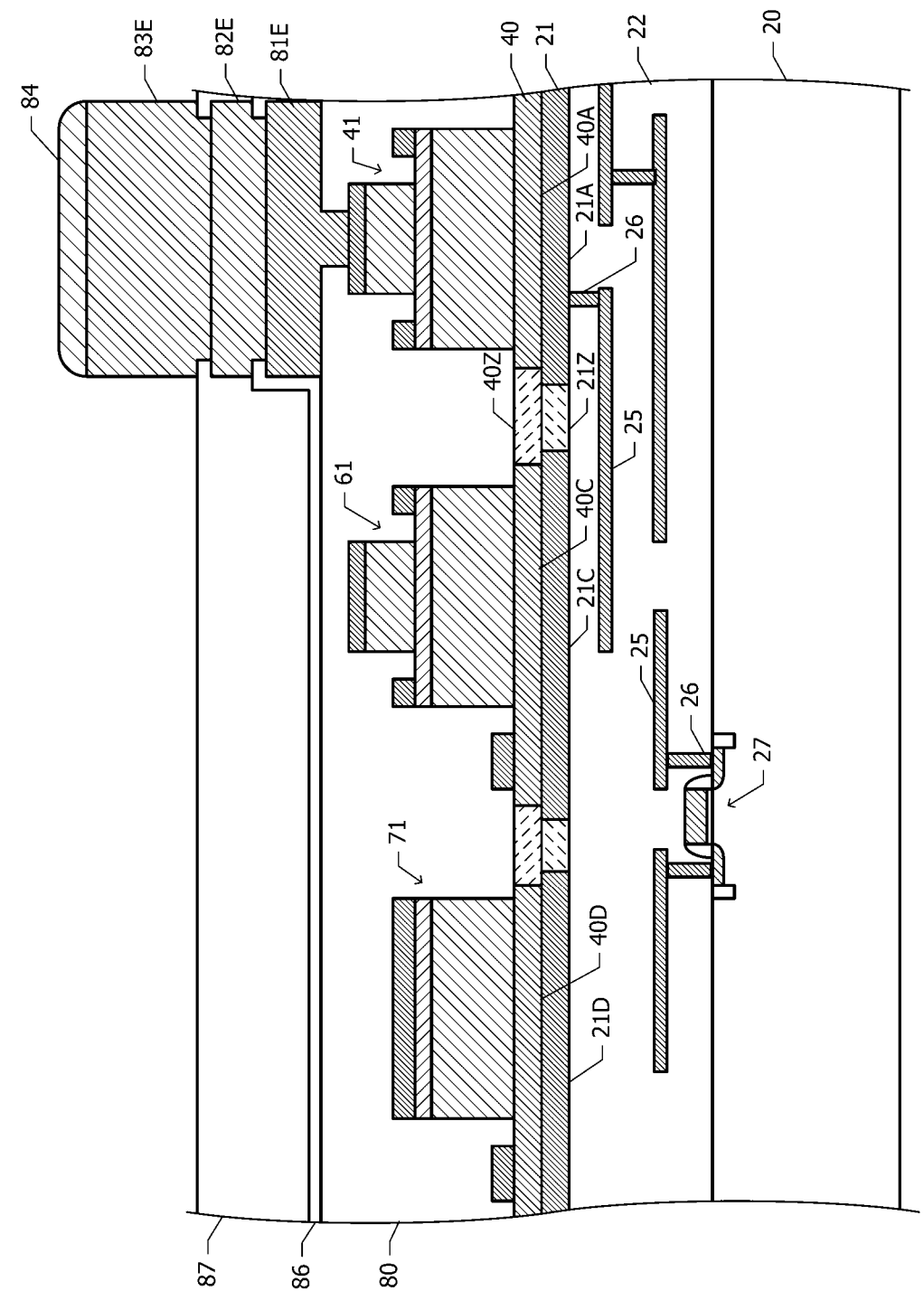
FIG. 15 is a cross-sectional view of a semiconductor device according to an eighth embodiment.

FIG. 15 is a cross-sectional view of the semiconductor device according to the eighth embodiment. In the eighth embodiment, the multi-layer wiring structure 22 is disposed between the substrate 20 and the bond layer 21. The multi-layer wiring structure 22 includes the plurality of wires 25 and the plurality of vias 26. A substrate-side transistor 27 is formed on and in the surface layer portion of the substrate 20. The substrate-side transistor 27 is, for example, a silicon-based MOS transistor or a silicon-based bipolar transistor.

The first metal region 21A included in the bond layer 21 is coupled to at least one wire 25 and at least one via 26 in the multi-layer wiring structure 22. Further, the substrate-side transistor 27 is also electrically coupled to at least one wire 25 and at least one via 26 in the multi-layer wiring structure 22. For example, a metal region included in the bond layer 21 is coupled to the substrate-side transistor 27 by using the wire 25 and the via 26 in the multi-layer wiring structure 22. Note that a metal region other than the first metal region 21A in the bond layer 21 may be coupled to a wire and a via in the multi-layer wiring structure 22.

Advantageous effects of the eighth embodiment will then be described.

Also in the eighth embodiment, like the first embodiment, the improvement of the characteristics of heat radiation from the first transistor 41 can be achieved. Further, in the eighth embodiment, an electronic circuit configured by using the substrate-side transistor 27 formed on and in the surface layer portion of the substrate 20 and an electronic circuit configured by using a semiconductor element, such as the first transistor 41, disposed on the foundation semiconductor layer 40 are electrically coupled by using the multi-layer wiring structure 22. This enables coupling of a compound-semiconductor-based semiconductor element and a silicon-based semiconductor element in the semiconductor device without using the module substrate or the like. A semiconductor module including the semiconductor device can thereby be downsized.

Modifications of the eighth embodiment will then be described. In the eighth embodiment, a wire 25 and a via 26 in the multi-layer wiring structure 22 are electrically coupled to each of the substrate-side transistor 27 or the like disposed below the bond layer 21 and the first transistor 41 or the like disposed above the bond layer 21. In a modification, a configuration in which a wire 25 and a via 26 in the multi-layer wiring structure 22 are electrically coupled to the substrate-side transistor 27 or the like below the bond layer 21 but are not electrically coupled to an element above the bond layer 21 may be employed. To couple the substrate-side transistor 27 or the like to the element above the bond layer 21 in this configuration, for example, the substrate-side transistor 27 or the like and the element may be electrically coupled by using a wire or the like on a side closer to the conductor protrusion and to the module substrate or may be electrically coupled by using the mutual coupling wire 82W (FIG. 4D) without the module substrate. Further, in another modification, a configuration in which a wire 25 and a via 26 in the multi-layer wiring structure 22 are electrically coupled to an element above the bond layer 21 but are not electrically coupled to an element on the substrate 20 below multi-layer wiring structure 22 may be employed.

In addition, the first metal region 21A electrically coupled to the first transistor 41 is electrically coupled to the via 26 and the wire 25 in the multi-layer wiring structure 22 in the eighth embodiment; however, a configuration in which the first metal region 21A is not coupled to the via 26 and the wire 25 in the multi-layer wiring structure 22 may be employed.

The modifications using the configuration in which the first metal region 21A is not coupled to the via 26 and the wire 25 in the multi-layer wiring structure 22 will then be described with reference to FIGS. 16 and 17.

Figure 16:
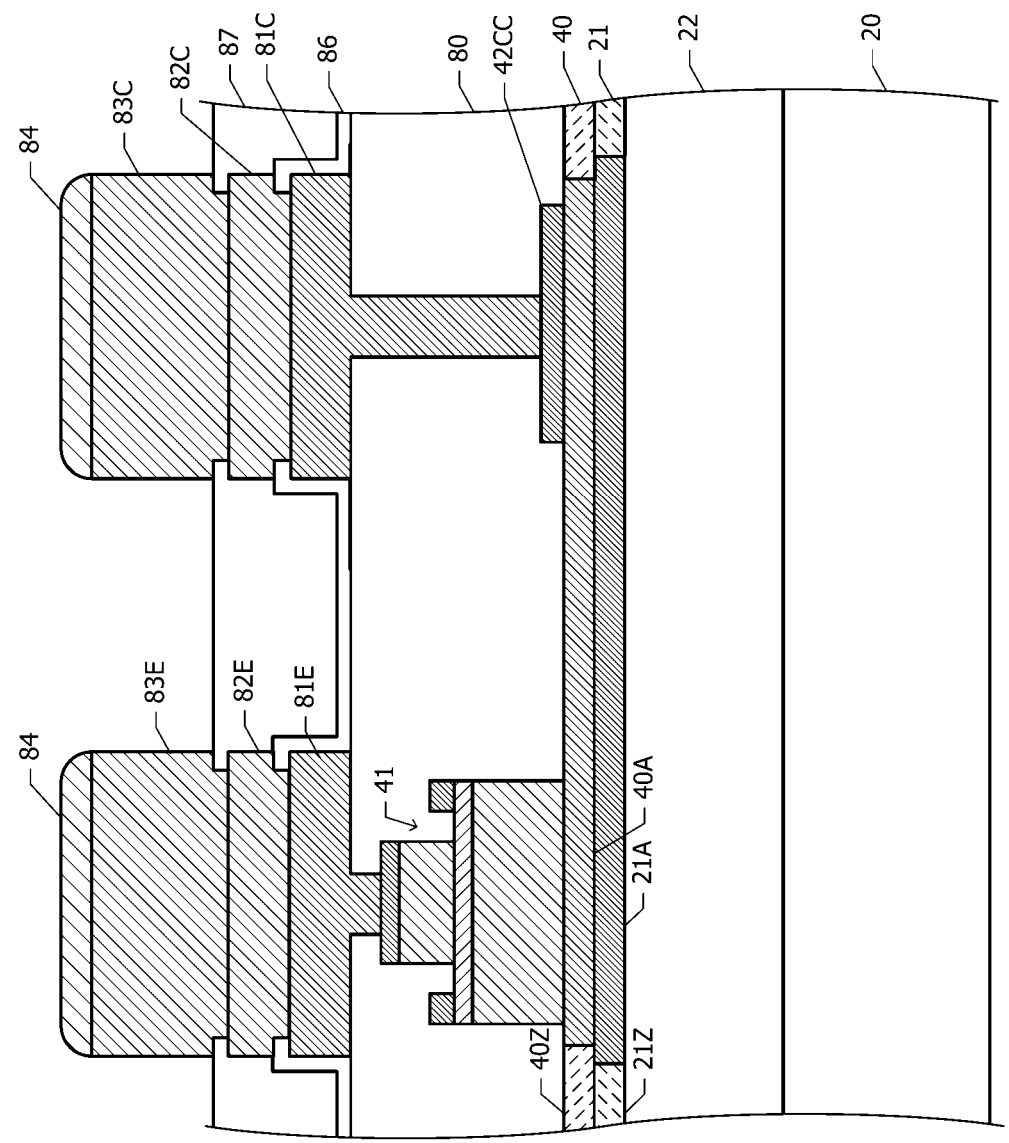
FIG. 16 is a cross-sectional view of a semiconductor device according to a modification of the eighth embodiment.

FIG. 16 is a cross-sectional view of a semiconductor device according to a modification of the eighth embodiment. The first metal region 21A is not coupled to a wire in the multi-layer wiring structure 22. The first metal region 21A and the first conducting region 40A spread on the plane, and a metal pattern 42CC is disposed on the first conducting region 40A as the spread portion. The metal pattern 42CC is covered with the interlayer dielectric 80. A first collector wire 81C is disposed on the interlayer dielectric 80. The first collector wire 81C is coupled to the metal pattern 42CC through a cavity provided in the interlayer dielectric 80.

A first collector pad 82C and a collector conductor protrusion 83C are disposed above the first collector wire 81C. The configuration of the first collector pad 82C and the collector conductor protrusion 83C is identical to the configuration of the first emitter pad 82E and the first conductor protrusion 83E. The solder 84 is put on the collector conductor protrusion 83. In the modification illustrated in FIG. 16, the collector of the first transistor 41 is coupled to an electronic circuit on the module substrate by using the collector conductor protrusion 83C.

The first conducting region 40A continuously extends from the region where the first transistor 41 is disposed to the region where the collector conductor protrusion 83C is disposed in the modification illustrated in FIG. 16; however, the first conducting region 40A does not have to be extended continuously. Even if the first conducting region 40A does not extend continuously, the collector of the first transistor 41 and the collector conductor protrusion 83C are electrically coupled by using the first metal region 21A.

The metal pattern 42CC is desirably disposed parallel to a line including the plurality of first transistors 41, for example, in the plan view illustrated in FIG. 5A. The layout performed in this manner enables the line including the plurality of first transistors 41 to be shortened compared with the comparative example illustrated in FIG. 5B.

Figure 17:
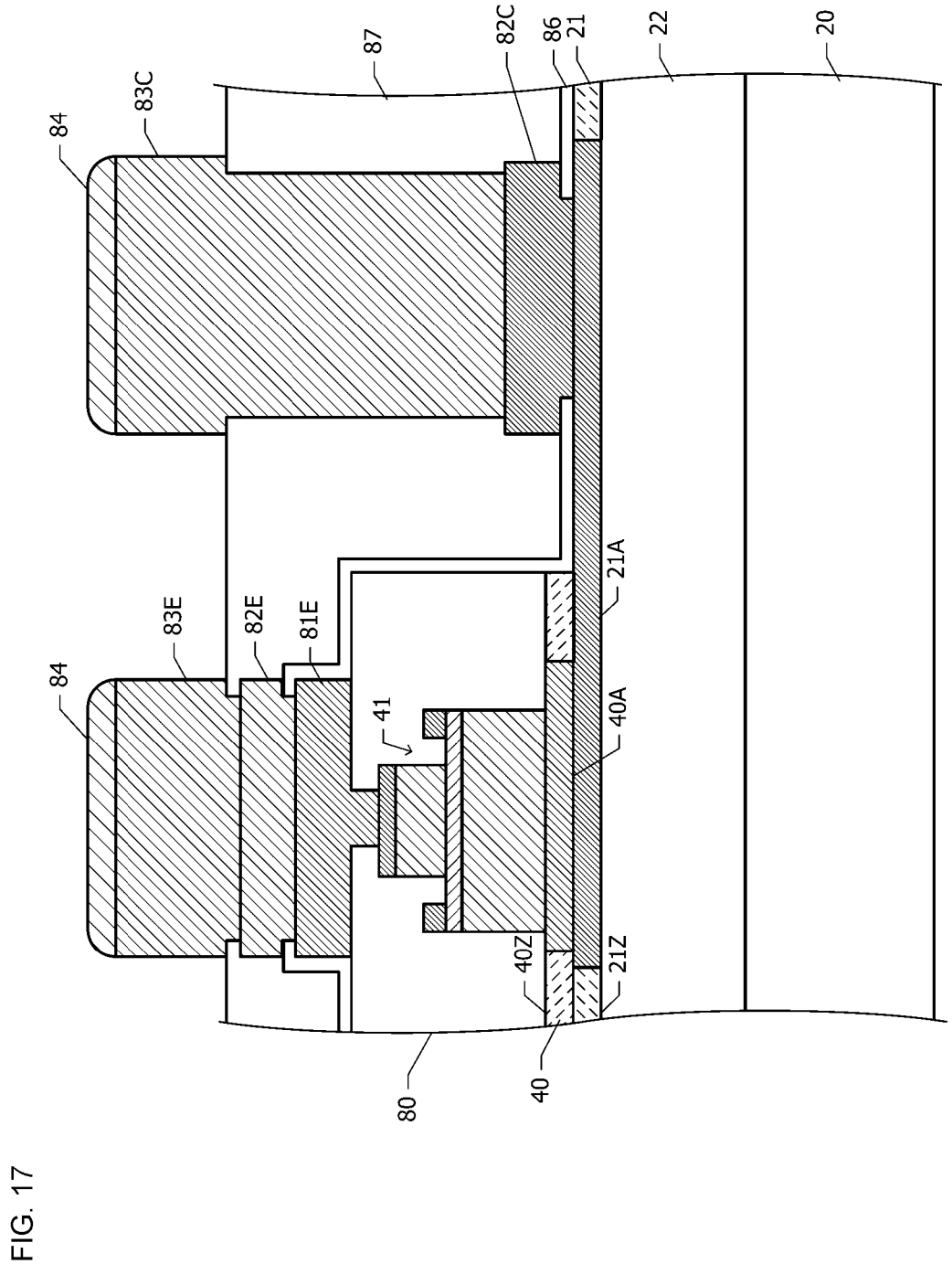
FIG. 17 is a cross-sectional view of a semiconductor device according to another modification of the eighth embodiment.

FIG. 17 is a cross-sectional view of a semiconductor device according to another modification of the eighth embodiment. Also in this modification, the first metal region 21A is not coupled to a wire in the multi-layer wiring structure 22. The collector conductor protrusion 83C is disposed in the inner side portion of the element forming layer 202 (FIG. 4D) in a plan view in the modification illustrated in FIG. 16, while the collector conductor protrusion 83C is disposed in the outer side portion of the element forming layer 202 (FIG. 4D) in a plan view in this modification.

In the plan view, the first metal region 21A spreads to the outer side portion of the element forming layer 202 (FIG. 4D), that is, to the outer side portion of the foundation semiconductor layer 40. The interlayer dielectric 86 is disposed on the bond layer 21 and in the outer side portion of the foundation semiconductor layer 40. The first collector pad 82C is disposed on the interlayer dielectric 86 in the outer side portion of the foundation semiconductor layer 40. The first collector pad 82C is coupled to the first metal region 21A through a cavity provided in the interlayer dielectric 86. The protective film 87 is disposed on the first collector pad 82C. The collector conductor protrusion 83C is disposed on the protective film 87. The collector conductor protrusion 83C is coupled to the first collector pad 82C through a cavity provided in the protective film 87. The solder 84 is put on the collector conductor protrusion 83C.

The first collector pad 82C is desirably disposed parallel to the line including the plurality of first transistors 41, for example, in the plan view illustrated in FIG. 5A. The layout performed in this manner enables the line including the plurality of first transistors 41 to be shortened compared with the comparative example illustrated in FIG. 5B.

As in this modification, the collector conductor protrusion 83C coupled to the collector of the first transistor 41 may be disposed in the region on which the foundation semiconductor layer 40 is not disposed in the plan view.

In the modifications of the eighth embodiment respectively illustrated with reference to FIGS. 16 and 17, a current path coupled parallel to the first metal region 21A may be formed by using a wire and a via in the multi-layer wiring structure 22. This enables reduction in the electrical resistance between the collector of the first transistor 41 and the collector conductor protrusion 83C.

The above-described embodiments are provided for an illustrative purpose, and it goes without saying that the configuration illustrated in different embodiments can be partially replaced or combined. The same operations and effects of the same configuration of the plurality of embodiments are not referred to in each embodiment one by one. Further, the present disclosure is not limited to the above-described embodiments. For example, it is obvious for those skilled in the art that various modifications, improvements, combinations, and the like can be made.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
    a substrate including a surface layer portion configured of a semiconductor material;
    a bond layer disposed on the surface layer portion of the substrate and including at least one metal region in a plan view;
    at least one semiconductor element disposed on the bond layer, the at least one semiconductor element including at least one first transistor disposed on a first metal region that is a metal region serving as the at least one metal region of the bond layer, and the first transistor including a collector layer electrically coupled to the first metal region, a base layer disposed on the collector layer, and an emitter layer disposed on the base layer,
    a first emitter electrode disposed on the emitter layer of the first transistor and electrically coupled to the emitter layer; and
    a first conductor protrusion disposed above the first emitter electrode, electrically coupled to the first emitter electrode, and protruding in a direction of going away from the substrate,
    thermal conductivity of the semiconductor material of the surface layer portion of the substrate being higher than thermal conductivity of each of the collector layer, the base layer, and the emitter layer of the first transistor.

2. The semiconductor device according to claim 1, wherein
    a plurality of the first transistors are provided, and each of a plurality of the first emitter electrodes is disposed on a corresponding one of the plurality of first transistors,
    the semiconductor device further comprising:
    a first emitter wire disposed between each first emitter electrode and the first conductor protrusion and coupling the plurality of first emitter electrodes to each other,
    wherein the first conductor protrusion is electrically coupled to the first emitter wire.

3. The semiconductor device according to claim 2, wherein
    a series of arrangements of the collector layer and the base layer of each of the plurality of first transistors extends over the plurality of first transistors.

4. The semiconductor device according to claim 1, wherein
    the semiconductor element further includes a second transistor disposed on a second metal region that is the metal region of the bond layer, and
    the second transistor includes a collector layer electrically coupled to the second metal region, a base layer disposed on the collector layer, and an emitter layer disposed on the base layer,
    the semiconductor device further comprising:
    a second emitter electrode disposed on the emitter layer of the second transistor and electrically coupled to the emitter layer of the second transistor; and
    a second conductor protrusion disposed above the second emitter electrode, electrically coupled to the second emitter electrode, and protruding in a direction of going away from the substrate.

5. The semiconductor device according to claim 1, wherein
    the semiconductor element further includes a third transistor disposed on a third metal region that is the metal region of the bond layer, and
    the third transistor includes a collector layer electrically coupled to the third metal region, a base layer disposed on the collector layer, and an emitter layer disposed on the base layer,
    the semiconductor device further comprising:
    a third emitter electrode disposed on the emitter layer of the third transistor and electrically coupled to the emitter layer of the third transistor,
    wherein a conductor protrusion to be coupled to the third emitter electrode is not provided.

6. The semiconductor device according to claim 5, further comprising:
    a third collector electrode disposed in an inner side portion of the third metal region and in an outer side portion of the third transistor in the plan view and electrically coupled to the third metal region.

7. The semiconductor device according to claim 1, wherein
    the semiconductor element further includes a diode disposed above a fourth metal region that is the metal region of the bond layer, and
    the diode includes a lower layer and an upper layer, the lower layer being disposed on the fourth metal region and configured of a semiconductor of a first conductor type, the upper layer being disposed on the lower layer and configured of a semiconductor of a second conductor type opposite from the first conductor type,
    the semiconductor device further comprising:
    an upper electrode disposed on the upper layer and electrically coupled to the upper layer.

8. The semiconductor device according to claim 7, further comprising:
    a lower electrode disposed, in the plan view, in an inner side portion of the fourth metal region and in an outer side portion of the diode and electrically coupled to the fourth metal region.

9. The semiconductor device according to claim 1, further comprising:
a foundation semiconductor layer disposed between the bond layer and the semiconductor element, wherein
the foundation semiconductor layer includes a conducting region overlapping with the metal region of the bond layer in the plan view, and
the conducting region of the foundation semiconductor layer electrically couples the metal region of the bond layer and the semiconductor element on the foundation semiconductor layer, the metal region overlapping with the conducting region in the plan view.

10. The semiconductor device according to claim 1, further comprising:
a foundation semiconductor layer disposed between the bond layer and the semiconductor element, wherein
the foundation semiconductor layer includes, in the plan view, a plurality of conducting regions and an element isolating region other than the conducting regions,
the collector layer of the first transistor is electrically coupled to the metal region of the bond layer by using one of the conducting regions of the foundation semiconductor layer,
the bond layer includes, in the plan view, an insulating region disposed in an outer side portion of the metal region,
the foundation semiconductor layer further includes a third conducting region disposed above the insulating region of the bond layer,
the semiconductor element further includes a third transistor disposed on the third conducting region, and
the third transistor includes a collector layer electrically coupled to the third conducting region, a base layer disposed on the collector layer, and an emitter layer disposed on the base layer,
a third emitter electrode disposed on the emitter layer of the third transistor and electrically coupled to the emitter layer of the third transistor; and
a third collector electrode disposed, in the plan view, in an inner side portion of the third conducting region and in an outer side portion of the third transistor and electrically coupled to the third conducting region.

11. The semiconductor device according to claim 1, further comprising:
a foundation semiconductor layer disposed between the bond layer and the semiconductor element, wherein
the foundation semiconductor layer includes, in the plan view, a plurality of conducting regions and an element isolating region other than the conducting regions,
the collector layer of the first transistor is electrically coupled to the metal region of the bond layer by using one of the conducting regions of the foundation semiconductor layer,
the bond layer includes, in the plan view, an insulating region disposed in an outer side portion of the metal region,
the foundation semiconductor layer further includes a fourth conducting region disposed above the insulating region of the bond layer,
the semiconductor element further includes a diode disposed on the fourth conducting region, and
the diode includes a lower layer and an upper layer, the lower layer being disposed on the fourth conducting region and configured of a semiconductor of a first conductor type, the upper layer being disposed on the lower layer and configured of a semiconductor of a second conductor type opposite from the first conductor type, and
an upper electrode disposed on the upper layer and electrically coupled to the upper layer; and
a lower electrode disposed, in the plan view, in an inner side portion of the fourth conducting region and in an outer side portion of the diode and electrically coupled to the fourth conducting region.

12. The semiconductor device according to claim 1, further comprising:
an insulating layer disposed between the surface layer portion of the substrate and the bond layer.

13. The semiconductor device according to claim 1, further comprising:
a multi-layer wiring structure disposed between the surface layer portion of the substrate and the bond layer.

14. The semiconductor device according to claim 13, wherein
the multi-layer wiring structure includes a plurality of wires and a plurality of vias, and the metal region of the bond layer is electrically coupled to at least one of the wires included in the multi-layer wiring structure.

15. The semiconductor device according to claim 13, further comprising:
at least one substrate-side transistor disposed on and in the surface layer portion of the substrate,
wherein the substrate-side transistor is coupled to one of the wires included in the multi-layer wiring structure.

16. The semiconductor device according to claim 1, wherein
the surface layer portion of the substrate is configured of silicon, and
the collector layer, the base layer, and the emitter layer of the first transistor are configured of a compound semiconductor.

17. The semiconductor device according to claim 2, wherein
the semiconductor element further includes a second transistor disposed on a second metal region that is the metal region of the bond layer, and
the second transistor includes a collector layer electrically coupled to the second metal region, a base layer disposed on the collector layer, and an emitter layer disposed on the base layer,
the semiconductor device further comprising:
a second emitter electrode disposed on the emitter layer of the second transistor and electrically coupled to the emitter layer of the second transistor; and
a second conductor protrusion disposed above the second emitter electrode, electrically coupled to the second emitter electrode, and protruding in a direction of going away from the substrate.

18. The semiconductor device according to claim 2, wherein
the semiconductor element further includes a third transistor disposed on a third metal region that is the metal region of the bond layer, and
the third transistor includes a collector layer electrically coupled to the third metal region, a base layer disposed on the collector layer, and an emitter layer disposed on the base layer, the semiconductor device further comprising:
a third emitter electrode disposed on the emitter layer of the third transistor and electrically coupled to the emitter layer of the third transistor,
wherein a conductor protrusion to be coupled to the third emitter electrode is not provided.

19. The semiconductor device according to claim 2, wherein
the semiconductor element further includes a diode disposed above a fourth metal region that is the metal region of the bond layer, and
the diode includes a lower layer and an upper layer, the lower layer being disposed on the fourth metal region and configured of a semiconductor of a first conductor type, the upper layer being disposed on the lower layer and configured of a semiconductor of a second conductor type opposite from the first conductor type,
the semiconductor device further comprising:
an upper electrode disposed on the upper layer and electrically coupled to the upper layer.

20. The semiconductor device according to claim 2, further comprising:
a foundation semiconductor layer disposed between the bond layer and the semiconductor element,
wherein
the foundation semiconductor layer includes a conducting region overlapping with the metal region of the bond layer in the plan view, and
the conducting region of the foundation semiconductor layer electrically couples the metal region of the bond layer and the semiconductor element on the foundation semiconductor layer, the metal region overlapping with the conducting region in the plan view.

* * * * *